US005731826A

United States Patent [19]

Hirano

[11] Patent Number: 5,731,826

[45] Date of Patent: Mar. 24, 1998

[54] INK JET RECORDING APPARATUS, INK JET RECORDING HEAD THEREFOR AND METHOD FOR DETERMINING THE EJECTION STATE THEREOF

[75] Inventor: Hirofumi Hirano, Yokohama, Japan

[73] Assignee: Canon Kabushiki Kaisha, Tokyo, Japan

[21] Appl. No.: 277,011

[22] Filed: Jul. 19, 1994

[30] Foreign Application Priority Data

Jul. 19, 1993 [JP] Japan .................................... 5-177875

[51] Int. Cl.[6] .............................. B41J 2/195; H01L 41/04

[52] U.S. Cl. ................................ 347/19; 347/7; 310/320; 310/324

[58] Field of Search .................................... 347/19, 43, 7, 347/23; 358/406, 504; 310/324, 320, 322

[56] References Cited

U.S. PATENT DOCUMENTS

| | | | |
|---|---|---|---|
| 4,199,767 | 4/1980 | Campbell et al. | 246/75 |
| 4,313,124 | 1/1982 | Hara | 346/140 R |
| 4,345,262 | 8/1982 | Shirato et al. | 346/140 R |
| 4,459,600 | 7/1984 | Sato et al. | 346/140 R |
| 4,463,359 | 7/1984 | Ayata et al. | 346/1.1 |
| 4,558,333 | 12/1985 | Sugitani et al. | 346/140 R |
| 4,604,633 | 8/1986 | Kimura et al. | 346/140 R |
| 4,608,577 | 8/1986 | Hori | 346/140 R |
| 4,610,202 | 9/1986 | Ebinuma et al. | 101/364 |
| 4,701,771 | 10/1987 | Ikeda | 346/140 R |
| 4,723,129 | 2/1988 | Endo et al. | 346/1.1 |
| 4,740,796 | 4/1988 | Endo et al. | 346/1.1 |
| 4,772,900 | 9/1988 | Nagoshi | 346/140 R |
| 4,775,868 | 10/1988 | Sugiura | 346/46 |
| 4,835,435 | 5/1989 | Yeung et al. | 310/324 |
| 4,860,034 | 8/1989 | Watanabe et al. | 346/140 R |
| 5,109,233 | 4/1992 | Nishikawa | 346/1.1 |
| 5,136,309 | 8/1992 | Iida et al. | 346/140 R |
| 5,315,317 | 5/1994 | Terasawa et al. | 346/1.1 |

FOREIGN PATENT DOCUMENTS

| | | |
|---|---|---|
| 0110634 | 6/1984 | European Pat. Off. . |
| 0124116 | 11/1984 | European Pat. Off. . |
| 0444861 | 9/1991 | European Pat. Off. . |
| 54-056847 | 5/1979 | Japan . |
| 57-20361 | 2/1982 | Japan . |
| 59-123670 | 7/1984 | Japan . |
| 59-138461 | 8/1984 | Japan . |
| 60-071260 | 4/1985 | Japan . |
| 61-230945 | 10/1986 | Japan . |
| 2-6142 | 1/1990 | Japan . |
| 2198888 | 7/1990 | Japan . |
| 5-8407 | 1/1993 | Japan . |
| WO8902827 | 4/1989 | WIPO . |

*Primary Examiner*—Joseph W. Hartary
*Assistant Examiner*—Craig A. Hallacher
*Attorney, Agent, or Firm*—Fitzpatrick, Cella, Harper & Scinto

[57] ABSTRACT

A preliminary ejection sensor of an ink jet recording apparatus includes a vibration plate adapted to vibrate on receipt of an ink droplet ejected from an ejection port on a recording head in order to detect the vibration of the vibration plate depending on variation of a gap between a core and the vibration plate, whereby it can be checked whether ink is ejected from the recording head or not. In addition, the preliminary ejection sensor can check the present ink ejecting state of the recording head. Thus, in contrast with a conventional sensing system wherein ink ejection is sensed by an optical sensor on one side surface of the recording head, the structure of the ink jet recording apparatus can be simplified. Additionally, in contrast with another conventional checking system wherein a temperature sensor is disposed on the recording head to indirectly check the present ink ejecting state of the recording head by monitoring the elevated temperature, the ink jet recording apparatus assures that a checking operation can quickly be achieved at a high accuracy. Consequently, the ink jet recording apparatus makes it possible to exactly detect whether or not ink is correctly ejected from ink ejection ports formed on the jet recording head.

24 Claims, 26 Drawing Sheets

SENSOR OUTPUT

EXTERIOR NOISE

THRESHOLD
COMPOSITE OUTPUT 1

CANCEL SENSOR OUTPUT

THRESHOLD
COMPOSITE OUTPUT 2

REFERENCE PULSE

INK JET RECORDING APPARATUS, INK JET RECORDING HEAD THEREFOR AND METHOD FOR DETERMINING THE EJECTION STATE THEREOF

BACKGROUND OF THE INVENTION

1. Field of the Invention

The present invention relates to an ink jet recording apparatus as well as an ink jet recording head employable for the ink jet recording apparatus. Further, the present invention relates to a method for determining the ejection state of an ink jet recording head for an ink jet recording apparatus of the foregoing type.

2 . Description of the Related Art

Many proposals have been hitherto made with respect to a recording apparatus for performing a recording operation for a recording medium such as paper, a sheet of material for OHP or a similar material (hereinafter referred to as a recording paper sheet or a paper sheet) in such a manner that a recording head operable in accordance with a various kind of recording system is mounted on the recording apparatus. The recording head for the recording apparatus is typically exemplified by a wire dot type recording head, a heat susceptible type recording head, a thermal image transferring type recording head and an ink jet type recording head.

Among the aforementioned conventional recording heads, sincere attention has been paid to the ink jet type recording head adapted to eject ink directly to a recording paper sheet because it is operated at a low running cost without any generation of noisy sound.

Since the ink jet type recording head having a plurality of fine ink ejection ports arranged thereon is generally employed for an ink jet recording apparatus of the foregoing type, in the case that gas bubbles or dust particles are involved in each ink ejection port or in the case that ink fails to be ejected from each ink ejection port of the recording head due to its increased viscosity caused by evaporation of an ink solvent or the ink is transformed to assume another state unsuitable for performing a recording operation therewith, a measure is taken such that factors associated with improper ink ejection are obviated by refreshing the ink (the foregoing measure is called an ejection recovering treatment).

This ejection recovering treatment is practically executed in accordance with the following manner. Specifically, ejection recovering treatment is executed such that an element for generating energy to be utilized for ejecting ink from each ejection port of the recording head is activated while a suitable ink receiving member is disposed opposite to the ejection port forming surface of the recording head so that ink is properly ejected from each ejection port of the recording head (this type of ejection recovering treatment is called preliminary ejection treatment). Otherwise, ejection recovering treatment is executed such that while the ejection port forming surface of the recording head is covered with a cap or the like, a certain intensity of sucking force is exerted on each ejection port of the recording head so as to allow a certain quantity of ink to be forcibly discharged from each ejection port of the recording head for the purpose of eliminating factors associated with improper ink ejection (this type of ejection recovering treatment is called suction recovering treatment).

In this connection, it is preferable that improper ink ejection detecting means is disposed in association with the aforementioned ejection recovering treatment. Since a large quantity of ink is consumed for executing the suction recovering treatment compared with the preliminary ejection treatment, it is desirable to employ the suction recovering treatment only in the case that the improper ejection factor which can not be eliminated by executing the preliminary ejection treatment is employed. To this end, it is recommendable that a measure is taken in such a manner as to enable the fact that ink is not ejected from the recording head to be detected. Such a measure as mentioned above has been hitherto taken such that an optical sensor is disposed at a side of the ink flying path in order to detect whether or not ink is ejected from the recording head. With respect to a recording head of the type utilizing thermal energy used therefor as energy to be utilized for ejecting ink therefrom, since the working temperature of the recording head is undesirably elevated when a thermal energy generating element is activated while ink is not ejected from the recording head, it is acceptable to determine based on detection of the elevated temperature of the recording head in which ink is not ejected from the recording head. However, in the case that the optical sensor is disposed in that way, there arises a malfunction that the whole structure of an ink jet recording apparatus is enlarged. On the contrary, in the case that the thermal energy generating element is employed in the aforementioned manner, since detection of failure of ink ejection is indirectly executed, there is a fear that it is impossible to quickly and exactly detect that ink is not ejected from the recording head.

On the other hand, with respect to detection of a quantity of remaining ink to be supplied to an ink jet recording head, in the case that a conventional open type ink tank, mainly, an ink tank having ink impregnated in a sponge material received therein is used for the ink jet recording head, the presence or absence of ink in the ink tank is determined by penetrating an electrical conductive needle into the sponge material to check the present electrical conductive state of the needle based on the variation of a resistance value of the sponge material. Otherwise, when a closed type ink tank having an ink bag received therein is used for the ink jet recording head, a negative pressure sensor is disposed in a flow path of the ink tank to check whether a certain quantity of ink remains in the ink tank or not. However, in the case that the open type ink tank is employed for the ink jet recording head, since it is necessary to insertably dispose the electrical conductive needle in the ink tank, causing a wiring member to be additionally disposed for the ink jet recording head, there sometimes arises an occasion that not only the ink tank or the ink jet recording apparatus itself becomes expensive and complicated in structure but also the electrical conductive needle penetrated into the sponge material has a problem in respect of a detecting accuracy. On the contrary, in the case that the negative pressure sensor is disposed in the ink tank, the ink jet recording head has a problem that the negative pressure sensor itself is expensive, causing the ink jet recording apparatus to correspondingly become expensive. Another problem is that it is necessary to reserve a space required for disposing the negative pressure sensor in the ink tank, and moreover, an ink supply path in the ink tank becomes complicated.

SUMMARY OF THE INVENTION

The present invention has been made in consideration of the aforementioned background.

An object of the present invention is to provide an ink jet recording apparatus which assures that abnormalities associated with an ink supplying system, e.g., failure of ink ejection and absence of ink in an ink tank can quickly and exactly be detected with a simple structure thereof.

Other object of the present invention is to provide an ink jet recording head which assures that useless consumption of ink can reliably be prevented and ink can effectively be used for achieving each recording operation therewith at a high efficiency.

Another object of the present invention is to provide an ink jet recording head which assures that abnormalities associated with the ink supplying system can be detected at a high efficiency without any reduction of a throughput of the recording head to be used for performing each recording operation.

Further object of the present invention is to provide a recording head unit preferably employable for an ink jet recording apparatus of the foregoing type.

According to a first aspect of the present invention, there is provided an ink jet recording apparatus having a recording head for performing a recording operation by ejecting ink from the recording head to a recording medium and means for executing ink ejection by activating the recording head when no recording operation is performed, comprising;

a vibration plate adapted to vibrate on receipt of the ink ejected from the recording head when no recording operation is performed, and checking means for checking the ink ejecting state of the recording head in consideration of the state of the vibration plate.

Here, the checking means may serve to check the ink ejecting state of the recording head in the presence of a certain intensity of induced electromotive force induced in a magnetic circuit including the vibration plate.

The checking means may serve to check the ink ejecting state of the recording head by utilizing the variation of an electrostatic capacity arising between the vibration plate and an electrical conductive plate disposed opposite to the vibration plate.

The vibration plate may be produced by vapor depositing aluminum on a substrate of elastic synthetic resin having a very small thickness.

The ink jet recording apparatus may further comprise;

means for removing from the vibration plate the ink shot onto the vibration plate from the recording head.

The removing means may comprise an ink absorbing member disposed with a small gap kept between the vibration plate and the ink absorbing member, the ink absorbing member having an opening portion formed therethrough for allowing the ejected ink to pass through the opening portion.

The removing means may comprise an ink removing plate having an opening portion formed therethrough for allowing the ejected ink to pass through the opening portion, the ink removing plate having an ink conducting groove having a small width additionally formed thereon in continuation from the opening portion.

The removing plate may be designed to exhibit a contour of circular plate, the opening portion is formed at the central part of the ink removing plate, and the outermost end of the ink conducting groove is kept opened on the outer peripheral surface of the circular plate and comes in contact with an ink absorbing member.

The removing means may be a layer of water repelling agent coated on the vibration plate or a vibration plate formed with a water repelling material.

The vibration plate may be inclined at a predetermined angle, and an ink absorbing member is disposed below the vibrating plate.

According to a second aspect of the present invention, there is provided an ink jet recording apparatus having a recording head for performing a recording operation by ejecting ink from the recording head to a recording medium and means for executing ink ejection by activating the recording head when no recording operation is performed, comprising;

checking means for checking the ink ejecting state of the recording head on receipt of the ink ejected from the recording head when no recording operation is performed, and noise sensing means for sensing exterior noise in association of the checking of the ink ejecting state of the recording head.

Here, the checking means may comprise a first sensor having a vibration plate adapted to vibrate on receipt of the ink ejected from the recording head when no recording operation is performed so that the checking means serves to check the ink ejecting state of the recording head in response to an output from the first sensor.

A certain intensity of induced electromotive force generated in a magnetic circuit including the vibration plate may be used for the first sensor.

The variation of an electrostatic capacity arising between the vibration plate and an electrical conductive plate disposed opposite to the vibration plate may be used for the first sensor.

The noise sensing means may comprise a second sensor having a vibration plate adapted to vibrate on receipt of a sound wave, and noise may be sensed in response to an output from the second sensor.

A certain intensity of induced electromotive force generated in a magnetic circuit including the vibration plate may be used for the second sensor.

The variation of an electrostatic capacity arising between the vibration plate and a electrical conductive plate disposed opposite to the vibration plate may be used for the second sensor.

An output from the noise sensing means may be reversed and the thus reversed output may be synthesized with an output generated on receipt of the ejected ink so that a checking operation is performed in response to the resultant synthesized output.

The output from the second sensor may be reversed and the thus reversed output may be synthesized with the output from the first sensor so that a checking operation is performed in response to the resultant synthesized output.

The noise sensing means may be mounted on a controlling circuit board of the ink jet recording apparatus.

According to a third aspect of the present invention, there is provided an ink jet recording apparatus having a recording head for performing a recording operation by ejecting ink from the recording head to a recording medium and means for executing ink ejection by activating the recording head when no recording operation is performed, comprising;

checking means for checking the ink ejecting state of the recording head on receipt of the ink ejected from the recording head when no recording operation is performed, and changing means for changing a frequency of activating the recording head for executing the checking when no recording operation is performed.

The checking means may serve to check that no ink is ejected from the recording head, and to determine an ejected ink speed from the recording head by measuring the time which elapses from ink ejection till receipt of the ejected ink.

The ink jet recording apparatus may include a plurality of recording heads corresponding to plural kinds of inks of which color tones are different from each other, the present recording head is changed to other recording head every time a single unit of recording operation is achieved with the present recording head, and activation of the other recording head to be executed when no recording operation is performed is executed in the course of changing of the present recording head to the other recording head.

Each of the recording heads may be scanned in a predetermined direction relative to the recording medium, and the changing of the present recording head to the other recording head is executed every time single scanning is completed.

Each of the recording heads may include an element for generating thermal energy required for inducing a phenomenon of film boiling in ink as energy to be utilized for ejecting ink therefrom.

The ink jet recording apparatus may include a plurality of recording heads corresponding to plural kinds of inks of which color tones are different from each other, the present recording head is changed to other recording head every time a single unit of recording operation is achieved with the present recording head, and activation of the other recording head to be executed while no recording operation is performed is executed in the course of changing of the present recording head to the other recording head.

Each of the recording heads may be scanned in a predetermined direction relative to the recording medium, and the changing of the present recording head to the other recording head may be executed every time single scanning is completed.

Each of the recording heads may include an element for generating thermal energy required for inducing a phenomenon of film boiling in ink as energy to be utilized for ejecting ink therefrom.

According to a fourth aspect of the present invention, there is provided an ink jet recording head having a plurality of liquid paths communicated with corresponding ejection ports for ejecting ink from the latter and a first ink flow path for conducting ink to the liquid paths, comprising;

- a remaining ink quantity detecting liquid path having an opening portion formed at the foremost end thereof for discharging ink from the opening portion, the remaining ink quantity detecting liquid path being utilized for detecting whether or not a certain quantity of ink remains still in an ink supply source, and
- a second ink flow path for conducting ink to the remaining ink quantity detecting liquid path via a path different from the first ink flow path.

Here, the ink jet recording head may comprise a branching point where ink to be supplied from the ink supply source is distributively divided into the first ink flow path and the second ink flow path, and an ink chamber disposed in the first ink flow path for receiving a predetermined quantity of ink therein.

The first ink flow path and the second ink flow path may be communicated directly with the ink chamber, and the second ink flow path being communicated with upstream the first ink flow path in the ink supply source.

The opening portion may be dimensioned to have an inner diameter larger than that of each of the ejection ports.

An element for generating energy to be utilized for ejecting ink from the opening portion may be disposed in the remaining ink quantity detecting liquid path.

The ink jet recording head may be include an element for generating thermal energy required for inducing a phenomenon of film boiling in ink as energy to be utilized for ejecting ink from the ejection ports and the opening portion.

The ink ejected from the opening portion by activating the element disposed in the ink jet recording head as defined in claim 33 or 34 may be received on the vibration plate so as to determine whether or not a certain quantity of ink remains in the ink supply source.

According to a fifth aspect of the present invention, there is provided recording head unit comprising;

- a cylindrical ink tank including a shaft portion along a center axis thereof and a plurality of ink chambers divided into sections with a radially extending partition wall disposed between adjacent ink chamber sections, and
- a plurality of recording heads arranged on one end surface of the cylindrical ink tank and communicated with the corresponding ink chamber sections, each of the recording heads including a plurality of ejection ports outwardly orienting in the substantially radial direction.

Here, a plurality of guide grooves extending in parallel with the center axis of the ink tank may be formed at positions corresponding to the ejection ports on the recording heads, and each of the guide grooves may serve to guide the slidable displacement of a head cap adapted to sealably cover the ejection ports on each of the recording heads therewith.

A surface of each of the recording heads having the ejection pores exposed to the outside may be inclined at a predetermined angle relative to the center axis of the ink tank, and each of the head caps may include a cap portion having an inclined surface inclined at the same angle as that of the inclined surface of each of the recording heads.

Each of the recording heads may comprise;

- a head tip firmly secured to an outer peripheral portion of a circular disc-shaped base plate at predetermined equiangular positions, the head tip having a plurality of heating elements corresponding to the ejection ports and a connecting pattern portion corresponding to each of the heating elements, and
- a grooved ceiling plate fixedly secured to the head tip, the grooved ceiling plate having a plurality of grooves formed thereon corresponding to the heating elements and a common liquid chamber formed therein while making communication with the grooves.

The base plate may include a hole formed at the central part thereof so as to allow the shaft portion extending therethrough and a plurality of opening portions of which number is coincident with that of the head tips, and further comprising;

- a flexible wiring plate firmly secured to the base plate, the flexible wiring plate including a plurality of connecting portions each extending through each of the opening portions to be connected to the connecting pattern portion and a plurality of contact portions concentrically arranged on the base plate with a predetermined angle kept between adjacent contact portions as seen in the circumferential direction of the base plate.

The ink tank may include a cylindrical extension on one end surface thereof, and the base plate may include a hole formed at the central part of the base plate to receive the cylindrical extension therein, and further comprising;

- a flexible wiring plate firmly secured to the cylindrical extension, the flexible wiring plate including a plurality of connecting portions each extending through the hole to be connected to the connecting pattern portion and a plurality of contact portions concentrically arranged on the base plate with a predetermined angle kept between adjacent contact portions as seen in the circumferential direction of the base plate.

According to a sixth aspect of the present invention, there is provided n ink jet recording apparatus, comprising;

a carrier rotatably mounting the recording head unit as defined in claim 36 and adapted to slidably move in the direction orienting in parallel with the center axis of the recording head unit.

According to a seventh aspect of the present invention, there is provided n ink jet recording apparatus, comprising;

a carrier rotatably mounting the recording head unit as defined in claim 37 and adapted to slidably move in the direction orienting in parallel with the center axis of the recording head unit, and means for opening and closing each of the head caps in response to the rotation of the recording head unit.

Here, the means for opening and losing each of the head caps, may comprise;

biasing means for normally biasing each of the head caps in the capping direction, a groove formed on each of the head caps in the direction perpendicular to the center axis of the recording head unit, and a member secured to the carrier and including an inclined cam portion adapted to be engaged with the groove.

According to an eighth aspect of the present invention, there is provided method for determining the ink ejecting state in an ink jet recording apparatus which forms images by ejecting ink to a recording medium, comprising the steps of;

ejecting ink to a vibration plate adapted to vibrate on receipt of the ink ejected, and determining the ink ejecting state in consideration of the state of the vibration plate.

According to an aspect of the present invention, the preliminary ejection sensor of the ink jet recording apparatus includes a vibration plate adapted to receive ink ejected from the recording head when no recording operation is performed so that the present ink ejecting state of the recording head e.g., whether ink is ejected from the recording head or not) is checked depending on the present state of the vibration plate (e.g., whether the vibration plate vibrates or not). Thus, in contrast with a conventional checking system wherein the ink ejecting state is checked by using a photosensor or the like, according to the present invention, the structure of the ink jet recording apparatus can be simplified. In addition, in contrast with another conventional checking system wherein the present ink ejecting state is checked indirectly by using a temperature sensor or the like, according to the present invention, checking of the present ink ejecting state of the recording head can quickly and exactly be achieved.

According to a further aspect of the present invention, since the ink jet recording apparatus is equipped with means for sensing exterior noise which may be received when the present ink ejecting state of the recording head is checked, checking of the present ink ejecting state of the recording head can exactly be achieved, e.g., by canceling factors associated with the exterior noise.

According to another aspect of the present invention, since the ink jet recording apparatus is equipped with means for changing the driving frequency of the recording head to other one when the present ink ejecting state of the recording head is checked, there does not arise a malfunction that the driving frequency of the recording head is synchronized with the frequency of exterior noise. Consequently, checking of the present ink ejecting state of the recording head can exactly be achieved.

According to still another aspect of the present invention, the ink jet recording apparatus includes a plurality of recording heads corresponding to plural kinds of inks each having a different color. With this construction, after a recording operation is completed for a single line by using a recording head adapted to eject ink having a specific color, the foregoing recording head section is changed to other recording head adapted to eject ink having a color different from the preceding one, and moreover, checking of the ink ejecting state of the recording head is checked in the course of the changing operation. Consequently, a checking operation can be achieved for each recording head at high efficiency.

According to yet another aspect of the present invention, a remaining ink quantity detecting liquid path and a second ink flow path associated with the remaining ink quantity detecting liquid path are formed in the recording head so as to detect a quantity of ink remaining in the recording head. Thus, in contrast with a conventional system wherein a quantity of consumed ink is detected in an ink supply source so as to determine whether ink remains in the recording head or not, according to the present invention, ink can effectively be used with the recording head for performing each recording operation.

Finally, according to yet another aspect of the present invention, since ink is ejected from the remaining ink quantity detecting flow path and the thus ejected ink is received on the vibration plate of the preliminary ejection sensor so as to detect a quantity of ink remaining in the recording head depending on the vibrating state of the vibrating plate, means for detecting the ink ejecting state can serve also as means for detecting a quantity of ink remaining in the recording head. Consequently, the structure of the ink jet recording apparatus can be simplified, and moreover, detecting of the quantity of ink remaining in the recording head can quickly and reliably be achieved.

Other objects, features and advantages of the present invention will become apparatus from reading of the following description which has been made in conjunction with the accompanying drawings.

DESCRIPTION OF THE PREFERRED EMBODIMENTS

The present invention will now be described below with reference to the accompanying drawings which illustrate preferred embodiments thereof.

Figure 1:
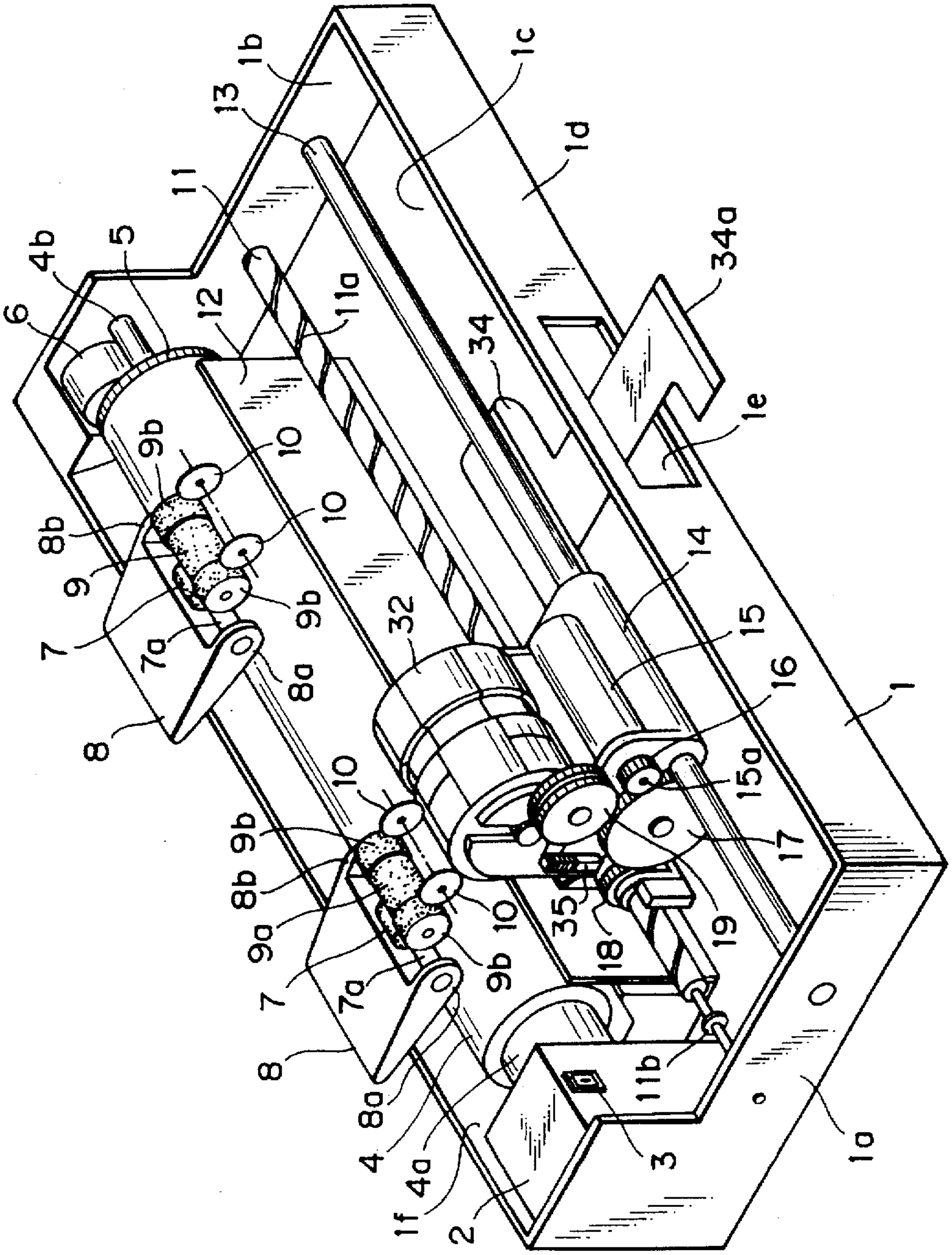
FIG. 1 is a perspective view of an ink jet recording apparatus constructed in accordance with a first embodiment of the present invention, showing the whole structure of the ink jet recording apparatus.
Figure 2:
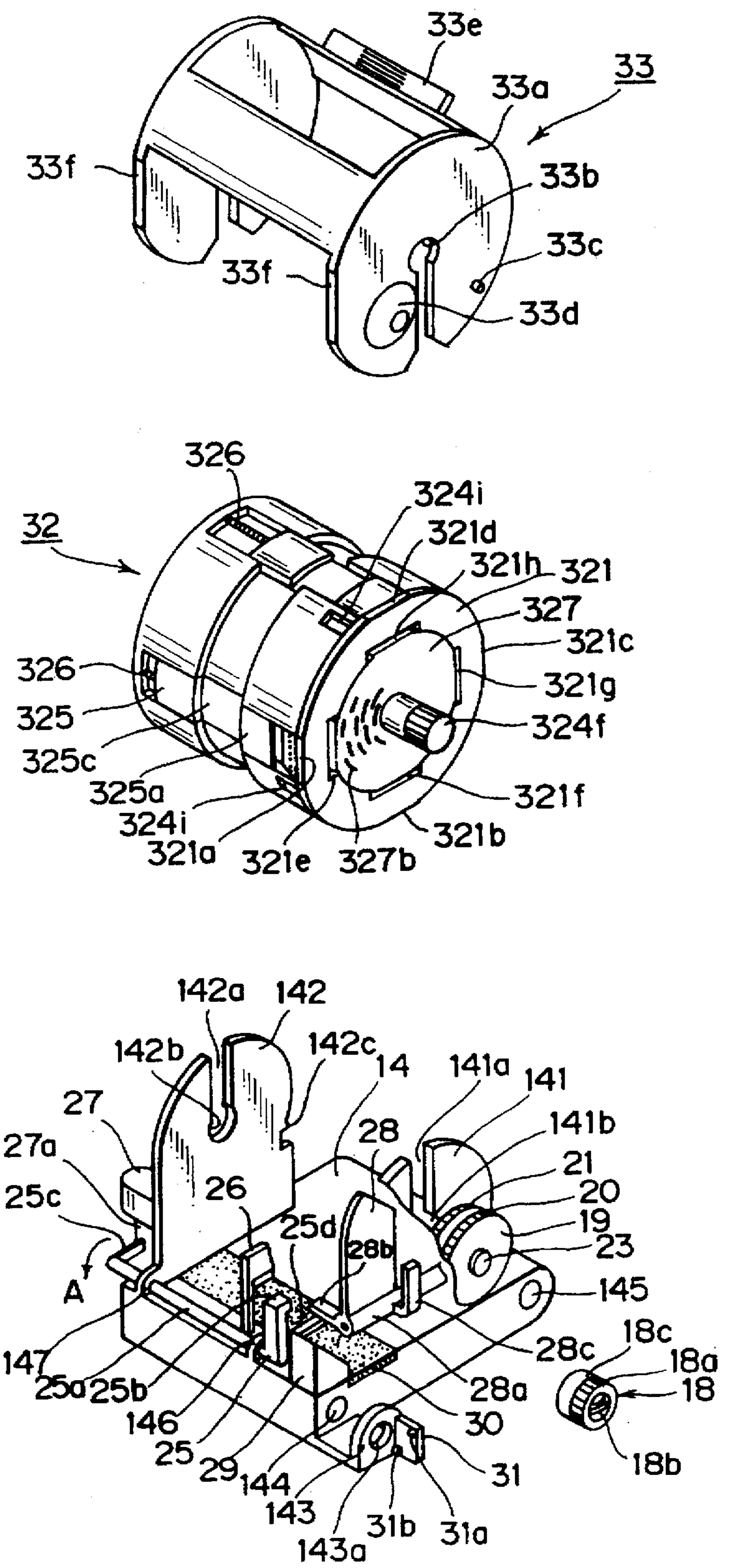
FIG. 2 is a perspective view of a carrier portion for the ink jet recording apparatus shown in FIG. 1, showing essential components constituting a carrier portion in the ink jet recording apparatus in the disassembled state.

First, an ink jet recording apparatus constructed in accordance with a first embodiment of the present invention will be described below with reference to FIG. 1 and FIG. 2 wherein FIG. 1 is a perspective view of the ink jet recording apparatus and FIG. 2 is a perspective view of a carrier portion for the ink jet recording apparatus, showing essential components constituting the carrier portion in the disassembled state.

In FIG. 1, reference numeral 1 designates a frame for the ink jet recording apparatus. Reference numeral 1a designates a left-hand side plate of the frame 1, and reference numeral 1*b* designates a right-hand side plate of the frame 1. Both the side plates 1*a* and 1*b* of the frame 1 face to each other while standing upright from a bottom plate 1*c* of the same. Reference numeral 1*d* designates a front plate of the frame 1. An opening portion 1*e* is formed through the front plate 1*d* so as to allow a flexible cable to be described later to extend therethrough. Reference numeral 1*f* designates a rear plate of the frame 1. Reference numeral 2 designates a recovering unit which is attached to the frame 1. The recovering unit 2 is intended to perform an operation for sucking ink from a plurality of ejection ports (hereinafter also referred to as ejection nozzles) with the aid of a cap to be described later by driving a pump (not shown) with the aid of a motor (not shown) so as to fill a recording head with ink or discharge ink having an increased viscosity therefrom. Reference numeral 3 designates the cap which is displaceably secured to the recovering unit 2. As desired, the cap 3 is displaced in the forward/rearward direction so as to come in tight contact with an ejection nozzle forming portion of the recording head. In addition, the cap 3 has functions for sucking ink from the ejection nozzles by the action of the sucking pressure generated by the pump communicated with the cap 3, and moreover, preventing the solidification of ink by liquidtightly closing the ejection nozzle forming portion with the cap 3 when the ink jet recording apparatus is held in the inoperative state or in the standby state. Reference numeral 4 designates a paper conveying roller of which cylindrical surface layer is lined with a synthetic resin such as polyurethene resin or the like having a high frictional coefficient. The interior of the paper conveying roller 4 is designed to have a cylindrical hollow space in which a waste ink absorbing block (not shown) is received. A left-hand end part 4*a* of the paper conveying roller 4 is rotatably supported by a bearing portion disposed on the side surface of the recovering unit 2, while a right-hand end part 4*b* of the same is rotatably supported by the right-hand side plate 1*b* of the frame 1. Reference numeral 5 designates a gear wheel which is firmly attached to the right-hand end of the paper conveying roller 4. Reference numeral 6 designates a motor for conveying a recording medium along the outer-peripheral surface of the paper conveying roller 4. The motor 6 is secured to the right-hand side plate 1*b* of the frame 1 and includes a pinion (not shown) on an output shaft thereof to mesh with the gear wheel 5. In this embodiment, a pulse motor is employed for the motor 6 so as to enable it to be rotated in the normal/reverse direction in response to a driving pulse fed from a controlling unit (not shown). Reference numeral 7 designates a power transmitting roller. The power transmitting roller 7 is normally biased by a spring means such as a coil spring, a leaf spring or the like (not shown) so that it comes in close contact with the outer peripheral surface of the paper conveying roller 4. At the same time, the power transmitting roller 7 comes in close contact with a paper discharging roller to be described later, causing the rotational force of the paper conveying roller 4 to be transmitted to a recording medium (not shown) via the power transmitting roller 7. To assure that the rotational force of the power transmitting roller 7 is reliably transmitted, the power transmitting roller 7 is molded of a material such as a rubber or the like having a high frictional coefficient. A roller shaft 7*a* is inserted through the power transmitting roller 7 along the center axis of the latter. Reference numeral 8 designates a paper discharging supporter. The paper discharging supporter 8 is operatively connected to the roller shaft 7*a* with a predetermined intensity of slidable or frictional force via arms 8*a* and 8*b* located at the opposite ends thereof. To this end, it is recommendable that the paper discharging supporter 8 is molded of an elastic material, e.g., polyacethal resin or the like, and the roller shaft 7*a* is fitted to the arms 8*a* and 8*b* of the paper discharging supporter 8 with an adequate intensity of tightening force. With this construction, it is easy to adjust an intensity of tightening force by forming a slit across the width of each of holes formed through the arms 8*a* and 8*b* of the paper discharging supporter 8. It should be noted that in the shown case, two paper discharging supporter 8 are arranged on the opposite sides of the paper conveying roller 4. Reference numeral 9 designates a paper discharging roller of which surface layer is molded with a material having a high frictional coefficient. The paper discharging roller 9 is held by a platen (not shown). The material employable for constituting the paper discharging roller 9 is exemplified by a rubber, a polyurethane resin or a similar elastic material. It is desirable that the paper discharging roller is prepared in the form of a roller-shaped member coated with the foregoing elastic material. Alternatively, the roller-shaped member and the foregoing elastic material may be molded integral with each other.

When the paper discharging roller 9 is designed such that opposite end parts 9*b* are dimensioned to have a diameter slightly larger than that of a central part 9*a* thereof (by a quantity of about 4%), causing the circumferential speed of the opposite end parts 9*b* of the paper discharging roller 9 to be slightly higher than that of the paper conveying roller 4, there does not arise a malfunction that a recording medium (hereinafter also referred to as a paper sheet) is warped during each recording operation. Consequently, the recording surface of the recording paper can always be maintained in a good operative state. In addition, since a pulley (to be described later) adapted to come in tight contact with the paper discharging roller 9 exhibits a low intensity of contacting force and a paper conveying pitch of the recording paper is taken as a reference for determining the speed of each paper conveying operation to be performed by paper feeding roller 4, the paper conveying force has no effect on a paper conveying accuracy.

Reference numeral 10 designates a pair of pulleys each of which is molded of a fluororesin or the like having a water repelling property. The outer peripheral edge part of each of pulleys 10 exhibits a sharp conical sectional contour and continuously contacts a paper sheet. The pulleys 10 are rotatably supported by a cover (not shown) in such a manner that they are rotated in the upward/downward direction, and moreover, they are normally biased by a spring member (not shown) adapted to generate a predetermined intensity of contacting force (it is preferable that this contacting force is set to about 10 g). In addition, the pulleys 10 are disposed at the positions located opposite to the opposite end parts 9*b* of the paper discharging roller 9, respectively.

Reference numeral 11 designates a lead screw. The lead screw 11 includes a lead groove 11*a* spirally formed along the outer peripheral surface thereof and a disc portion 11*b* disposed at the left-hand end thereof. In addition, the lead screw 11 is immovably bridged between both the side plates 1*a* and 1*b* of the frame 1 without any rotation relative to the latter while extending in parallel with the paper conveying roller 4. Reference numeral 12 designates a paper retaining plate which is made of a sheet of resilient material such as stainless steel or a similar metallic material. The paper retaining plate 12 is secured to the bottom plate 1*c* of the frame 1 with an upright attitude and comes in contact with the paper conveying roller 4 with a predetermined intensity of pressure. Since the paper retaining plate 12 exhibits a function of imparting a certain intensity of conveying force to a paper sheet while coming in contact with the latter when the paper sheet is conveyed by the paper conveying roller 4 along the outer peripheral surface of the latter, it is desirable that the contact part of the paper retaining plate 12 adapted to come in contact with the paper sheet during each paper conveying operation is coated with a fluororesin or a similar material. It is more preferable that small-sized pinch rollers (not shown) are arranged in the vicinity of the paper conveying roller 4. Reference numeral 13 designates a guide shaft. The guide shaft 3 is bridged between both the side plates 1*a* and 1*b* of the frame 1 while extending in parallel with the lead screw 11. Reference numeral 14 designates a carrier. The carrier 14 is displaceably supported by the lead screw 11 and the guide shaft 13 while it is threadably engaged with the lead screw 11 so as to be displaced in the axial direction of the lead screw 11. Reference numeral 15 designates a carrier motor. The carrier motor 15 is mounted on the carrier 14, and it is preferable that a pulse motor adapted to be rotationally driven in response to a predetermined pulse signal or a DC servomotor is employed for the carrier motor 15. Reference numeral 15*a* designates a driving shaft. Reference numeral 16 designates a pinion for the carrier motor 15. The pinion 16 is fixedly secured onto the driving shaft 15*a* of the carrier motor 15. Reference numeral 17 designates an idle gear which is freely rotatably supported on a shaft extending outside of the carrier 14. The idle gear 17 meshes with the pinion 16 for the carrier motor 15. Reference numeral 18 designates a drive gear which is rotatably fitted to the carrier 14 with positional restriction in respect of displacement thereof in the axial direction. A gear portion 18*a* of the drive gear 18 meshes with the idle gear 17. The lead screw 11 extends through the drive gear 18 along a center axis of the latter.

As shown in FIG. 2, an engagement portion 18*b* formed around the inner peripheral surface of the drive gear 18 is slidably engaged with the lead groove 11*a* of the lead screw 11. It should be added that the whole drive gear 18 is molded of a synthetic resin based magnet in such a manner that a magnetizing portion 18*c* located adjacent to the gear portion 18*a* of the drive gear 18 is equally divided into a plurality of north poles and a plurality of south poles which are alternately magnetized in the circumferential direction. Alternatively, the magnetizing portion 18*c* of the drive gear 18 may be constructed such that a ring-shaped member separately molded of other kind of magnetic material (e.g., ferrite magnet, aluminum nickel cobalt based magnet, rare earth element-transition metal based magnet or the like) is integrated with the drive gear 18. Reference numeral 19 designates a clutch gear which meshes with the idle gear 17.

Figure 3:
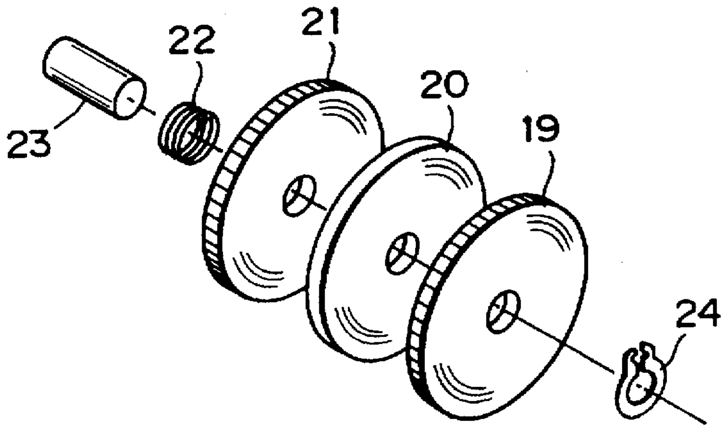
FIG. 3 is a perspective view of a clutch portion for the carrier portion shown in FIG. 2, showing essential components constituting the clutch portion in the disassembled state.

Next, the detailed structure of a clutch portion will be described below with reference to FIG. 3. Reference numeral 20 designates a frictional plate which is made of a material having a comparatively high frictional coefficient such as felt, cork or the like to exhibit a circular contour. The frictional plate 20 is disposed between a clutch gear 19 and a changing gear 21. Reference numeral 22 designates a clutch spring which is prepared in the form of a compression coil spring for normally biasing the changing gear 21 in the axial direction. Reference numeral 23 designates a clutch gear shaft which is immovably held in the carrier 14 at a predetermined position. Reference numeral 24 designates a grip ring which is firmly fitted onto the clutch gear shaft 23 to receive the biasing force of the clutch spring 22.

The clutch portion constitutes a frictional clutch in the presence of the frictional plate 20 serving as a frictional member in order to turn a head unit (to be described later) with the aid of the clutch gear 19 on the input side and the shift gear 21 on the output side of the clutch portion. Incidentally, reliability of the clutch portion can be improved by employing a so-called hysteresis clutch for transmitting a certain intensity of power via the clutch portion by using a magnetized magnetic plate in place of the frictional plate.

Referring to FIG. 2 again, the detailed structure of the carrier 14 will be described below. Reference numeral 141 designates a carrier side plate A. A slot portion 141*a* for permitting a predetermined part of the head unit (to be described later) to be inserted thereinto when the head unit is mounted on the ink jet recording apparatus as well as a bearing portion 141*b* for turnably holding the head unit are formed on the carrier side plate A 141. Reference numeral 142 designates a carrier side plate B. Similar to the carrier side plate A 141, a slot 142*a* and a bearing portion 142*b* are formed through the carrier side plate B 142. To restrictively define an extent of the turning movement of a head case (to be described later), a notch 142*c* is formed in the carrier side plate B 142. Reference numeral 143 designates a holder which restricts the displacement of the drive gear 18 in the thrusting direction, and moreover, serves also as a fitting portion for a home position sensor (to be described later). Reference numeral 143*a* designates a bearing portion for allowing the lead screw 11 to be inserted therethrough, and reference numeral 144 designates a bearing portion similar to the bearing portion 143*a*. Reference numeral 145 designates a bearing portion for allowing the guide shaft 13 to be inserted therethrough. Reference numeral 146 designates a bearing portion for rotatably supporting the shaft portion of a changing lever (to be described later), and reference numeral 147 designates a bearing portion similar to the bearing portion 146. Reference numeral 25 designates the changing lever, reference numeral 25*a* designates the shaft portion of the changing lever 25, reference numeral 25*b* designates a locking portion, reference numeral 25*c* designates an actuating arm portion, and reference numeral 25*d* designates a releasing arm portion, respectively. The shaft portion 25*a* of the changing lever 25 is rotatably supported by the bearing portions 146 and 147 on the carrier 14. In addition, the displacement of the shaft portion 25*a* of the changing lever 25 in the thrusting direction is restricted by a restricting member (not shown), and in the shown case, the locking portion 25*b* is capable of being turned about the shaft portion 25*b* only (see FIG. 11A and FIG. 11B). Reference numeral 26 designates a cap lever which stands upright from the carrier 14 at a predetermined position. Reference numeral 27 designates a solenoid which is activated for performing a changing operation. The solenoid 27 is constructed in a plunger type, and when it is turned on, a plunger 27*a* is attractively received in the solenoid 27 by the magnetic force generated by the latter. An outer end part of the actuating arm portion 25*c* of the changing lever 25 is turnably connected to the lower end part of the plunger 27*a*, and as the plunger 27*a* is actuated after the solenoid 27 is turned on, the changing lever 25 is turned in the anticlockwise direction as seen in FIG. 2 (i.e., in the arrow A-marked direction). Subsequently, when the solenoid 27 is turned off, the plunger 27*a* is restored to the original position by a return spring (not shown), causing the changing lever 25 to be turnably restored to the original position. Reference numeral 28 designates a contact lever which is composed of a turn shaft 28*a*, a turn lever 28*b* and a set lever 28*c* to form an integral structure with the foregoing components. The contact lever 28 is turnably supported by bearing portions (not shown) in the carrier 14.

The foremost end of a flexible cable (not shown) is secured to the rear surface of the contact lever 28 at a predetermined position, and a semispherical protuberance is formed on the rear surface of the contact lever 28 as a contact portion at the position located opposite to the contact portion of a recording head (to be described later) so as to enable electricity to be fed to the recording head via the semispherical protuberance.

The contact lever 28 is normally biased by a spring (not shown) so that the contact portion of the contact lever 28 is brought in contact with a contact portion of the recording head with a predetermined intensity of contact pressure. A turn lever 28*b* is located above the arm releasing portion 25*d* of the changing lever 25 to be engaged with the same, and as the changing lever 25 is turned, the contact lever 28 is turned in synchronization with the turning movement of the changing lever 25. Reference numeral 29 designates a preliminary ejection detecting sensor (hereinafter referred to as a preliminary ejection sensor). The preliminary ejection sensor 29 is disposed on the carrier 14 at the position where it faces to the recording head (to be described later) when rotation of the recording head is stopped at a predetermined angle relative to the carrier 4.

Figure 4:
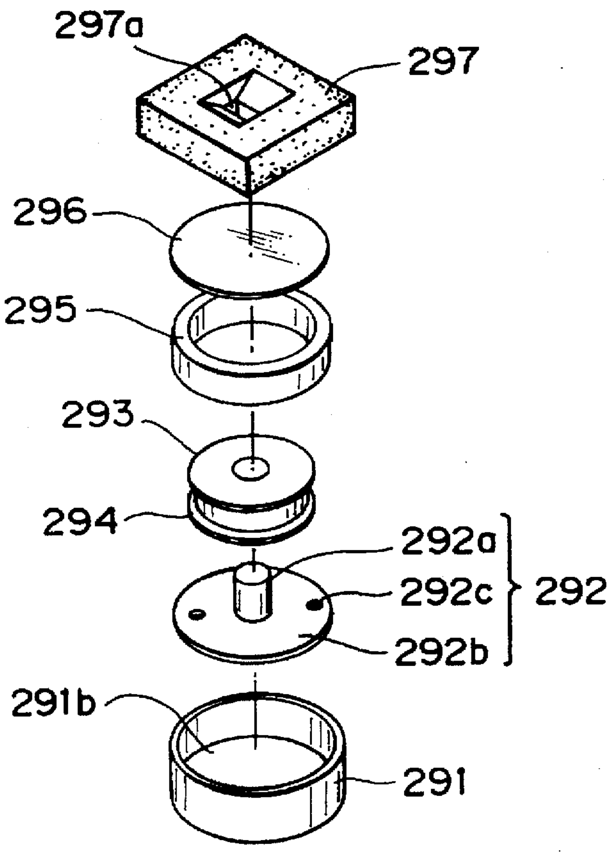
FIG. 4 is a perspective view of a preliminary ejection sensor for the carrier portion shown in FIG. 2, showing essential components constituting the preliminary ejection sensor in the disassembled state.

The preliminary ejection sensor 29 is constructed in the same manner as a so-called microphone, and FIG. 4 shows by way of example the detailed structure of the preliminary ejection sensor 29 in its disassembled state. In the figure, reference numeral 291 designates a case which is designed to have a bottom plate **291*b* while exhibiting a cylindrical configuration. The case 291 is formed integral with the bottom plate 291. Reference numeral 292 designates a structural member which constitutes a core. The structural member 292 is constructed such that a column-shaped core portion 292*a* made of a highly magnetizable material, i.e., a material having a high magnetic permeability (e.g., iron or the like) is integrated with a bottom plate 292*b* and two small holes 292*c* are formed through the bottom plate 292*b*. The formation of the two small holes 292*c* in that way assures that a vibration plate (to be described later) easily vibrates. As a sound wave is applied to the preliminary ejection sensor 29 through the small holes 292*c*, the preliminary ejection sensor 29 exhibits monodirectionality but not full directionality effective in any direction while it is held in the closed state (although it exhibits specific directionality at a part of the rear surface thereof). In practice, the formation of the two small holes 292*c* in that way is intended to reducibly suppress the appearance of a sound wave as a noise as far as possible when the preliminary ejection sensor 29 detects any preliminary ejection of ink. The core 292 is fixedly secured to the base plate 292*b* of the case 291. Reference numeral 293 designates a bobbin, and reference numeral 294 designates a coil which is wound about the bobbin 293. An output terminal (not shown) projected from the coil 294 is connected to a flexible cable to be described later. The bobbin 293 is fitted onto the core 292. Reference numeral 295 designates a magnet which is designed to exhibit a cylindrical configuration. The opposite ends of the magnet 295 are magnetized to serve as a north magnetic pole as well as a south magnetic pole. The magnet 295 is dimensioned to have an inner diameter slightly larger than an outer diameter of the bobbin 293 as well as an outer diameter slightly smaller than an inner diameter of the case 291, and it is secured to the bottom plate 292*b*. Reference numeral 296 designates a vibration plate which is molded of a material having a high magnetic permeation coefficient (e.g., iron or the like) to exhibit the shape of a circular board having a small thickness. The vibration plate 296 is attached to the upper surface of the magnet 295. Reference numeral 297 designates a preliminarily ejected ink absorbing member (hereinafter referred to as a preliminarily ejected ink absorber) which is disposed above the upper surface of the vibration plate 296 with a gap kept therebetween. The preliminarily ejected ink absorber 297 is formed with a slit-like opening 297*a* at its central portion. The preliminarily ejected ink absorber 297** is molded of a porous material such as a polyolefin based sintered material or a similar material, and it is subjected to hydrophylic treatment.

Figure 5:
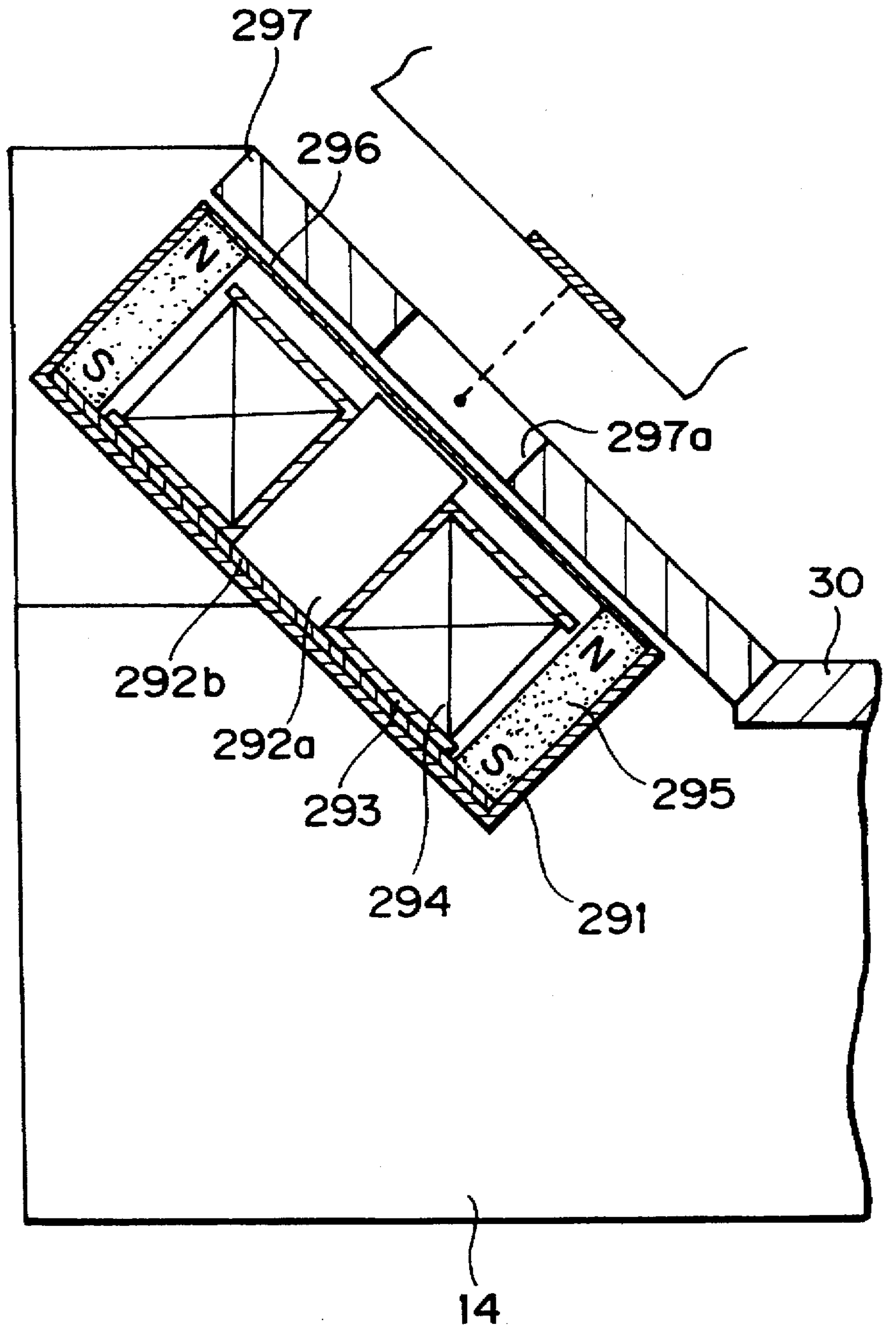
FIG. 5 is a sectional view of the preliminary ejection sensor shown in FIG. 4.

FIG. 5 shows by way of sectional view the structure of the preliminary ejection sensor 29. The magnetic force of the magnet 295 permeates through the bottom plate **292*b* of the core 292, the core portion 292*a* and the vibration plate 296, whereby the magnetizing force is concentratively collected in the small gap between the core portion 292*a* and the vibration plate 296. As the vibration plate 296 vibrates in response to a sound wave or on receipt of an ink droplet (to be described later), a magnitude of the foregoing small gap varies, causing the magnetic flux to vary correspondingly. This leads to the result that an electricity generating force is generated in conformity with a Faraday's electromagnetic induction rule. When the electricity generating force is amplified and then taken out of the magnet 295 based on an adequately preset threshold value, it become possible to know that a preliminarily ejected ink droplet is shot onto the vibration plate. In FIG. 5, reference numeral 30 designates an absorber for the carrier 14. This absorber 30 is molded of a hydrophylic porous material similar to that for the aforementioned preliminarily ejected ink absorber 297, and it is fitted to the carrier 14 at a predetermined position on the latter while coming in contact with a part of the preliminarily ejected ink absorber 297. An extra quantity of ink in excess of an ink absorbing ability of the preliminarily ejected ink absorber 297 is absorbably displaced to the absorber 30 via the contact portion between the preliminarily ejected ink absorber 297 and the absorber 30** on appearance of a capillary phenomenon.

Figure 6:
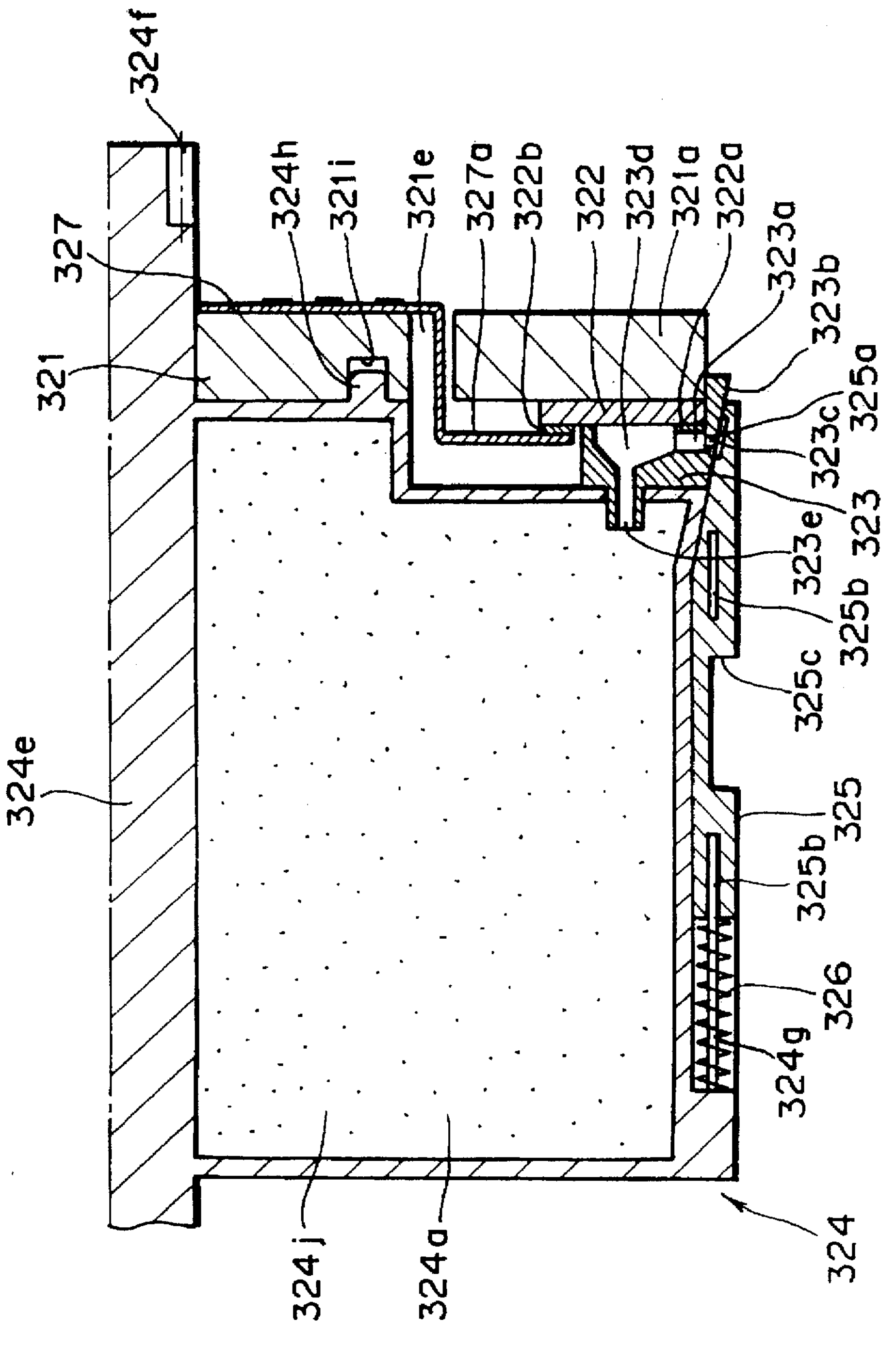
FIG. 6 is a fragmentary sectional view of the ink jet recording apparatus shown in FIG. 1.

Referring to FIG. 2 and FIG. 6 that is a fragmentary enlarged sectional view of FIG. 2, reference numeral 31 designates a home position sensor which is attached to the holder 143 of the carrier 14 at a predetermined position on the holder 143. A light emitting diode **31*a* and a light receiving transistor 31*b* are diametrically disposed on the holder 143, and a line segment joining the light emitting diode 31*a* and the light receiving transistor 31*b* to each other is located to orient in the same direction as that of the lead groove 11*a* of the lead screw 11 at the same angle as a lead angle of the lead groove 11*a*. This construction makes it possible to provide a photointerrupter which can detect the lead groove 11*a* of the lead screw 11 as well as the circular disc portion 11*b* of the lead screw 11. Reference numeral 32 designates a recording head unit, and reference numeral 321 designates a circular disc-shaped base plate which is made of a metallic material such as aluminum or the like. Four fixing portions 321*a* to 312*d* are formed for a head tip at four positions on the base plate 321 positioned in the equally spaced relationship as seen in the circumferential direction, and four opening portions 321*e* to 321*h* are formed through the base plate 321 so as to allow end parts of a flexible wiring plate to pass therethrough. Reference numeral 321*i* (FIG. 6) designates a hole for properly determining the position to be assumed by an ink tank to be described later. In FIG. 6, reference numeral 322 designates a head tip made of a silicon wafer. A plurality of resistor elements and a circuit pattern are formed on the head tip 322** of silicon wafer.

In this embodiment, an ink jet head of the type for ejecting ink by utilizing pressure caused by a foaming phenomenon appearing in ink as the ink is heated is employed for the recording head unit 32. In more detail, the head tip 322 includes a plurality of heating elements **322*a* located to form a single row corresponding to the ejection nozzles at one end thereof, and moreover, it includes a plurality of connecting pattern portions 322*b* corresponding to the heating elements 322*a* at the other end thereof. The head tip 322 is fixedly secured to the base plate 321 at a predetermined position on the latter. Reference numeral 323 designates a grooved ceiling plate. A plurality of grooves 323*a* are formed on the grooved ceiling plate 323 corresponding to the heating elements 322*a* of the head tip 322. The grooves 323*a* serve as an ink foaming chamber. A front wall 323*b* of the grooved ceiling plate 323 comes in contact with an end surface of the head tip 322 and an end surface of the base plate 321, and a plurality of small holes (nozzles) 323***c* are formed through the front wall of the grooved ceiling plate 323 corresponding to the respective grooves 323*a*. It should be noted that the front surface of the front wall 323*b* is formed at a predetermined angle corresponding to a head cap to be described later. Reference numeral 323*d* designates a common liquid chamber, reference numeral 323*e* designates an ink introducing portion, and reference numeral 324 designates an ink tank. The ink tank 324 is constructed such that the grooved ceiling plate 323 is thrusted against the head tip 322 so as to allow it to be immovably held and four ink chambers 324*a* to 324*d* usable four kinds of colors are molded integral with each other (in this embodiment, since the ink tank 324 is used for four kinds of colors, it is equally divided into four ink chambers each exhibiting a sector-shaped contour). The ink tank 324 includes a shaft portion 324*e* which extends along a center axis thereof, and a head gear 324*f* adapted to mesh with the changing gear 21 when the recording head unit 32 is mounted onto the carrier 14 is formed at the right-hand end of the shaft portion 324*e* as seen in FIGS. 2 and 6. Reference numeral 324*g* designates a guide groove for guiding the slidable displacement of a head cap (to be described later), and reference numeral 324*h* designates a positioning pin which is firmly fitted into the positioning hole 321*i* formed on the base plate 321. Reference numeral 324*i* (FIG. 2) designates rotational positioning holes, and reference numeral 324*j* designates an ink holding member which is molded of a spongy material having a number of communication pores formed therein. An ink holding member 324*j* is received in each of the ink chambers 324*a* to 324*d* in which four kinds of inks are impregnated. Reference numeral 325 designates a head cap which includes a cap portion 325*a* for covering the front surface of the front wall 323*b* having the nozzles 323*c* on the grooved ceiling plate 323 formed therethrough as well as a guide portion 325*b* adapted to be engaged with the guide groove 324*g* of the ink tank 324. An actuating groove 324*c* adapted to be engaged with the cap lever 26 is formed on the head cap 325. The guide portion 325*b* and the guide groove 324*g* are normally engaged with each other. Thus, the head cap 325 can be displaced along the guide groove 324*g* in the axial direction. Reference numeral 326 designates a spring for returning the head cap which normally biases the head cap 325 in the capping direction. Reference numeral 327 designates a flexible wiring plate having a plurality of contacts formed thereon. The flexible wiring plate 327 includes connecting portions 327*a* at four locations for making connection to the head tips 322, and the connecting portions 327*a* extend through opening portions 321*e* to 321*h* so that they are electrically connected to the head tips 322 via electrical conductive surfaces. Reference numeral 327*b* designates a plurality of contact portions which are arranged with an adequate gap kept between adjacent ones and electrically connected to signal lines each extending from the head tip 322. The contact portions 327*b* are concentrically arranged in the spaced relationship with a predetermined angle kept between adjacent ones as seen in the circumferential direction. To reduce the number of contacts, a plurality of diodes may be incorporated in the head tip 322 so as to enable a matrix driving operation to be achieved therewith. Alternatively, an integral circuit may be incorporated in the head tip 322 so as to enable the recording head 32 to be driven in response to a serial signal.

Referring to FIG. 2, the contact portions 327*b* are concentrically arranged at four locations as seen in the circumferential direction so as to allow each contact portion 327*a* to exhibit a same pattern, but a part of the contact portions 327*b* is not shown in FIG. 2 for the purpose of simplification of illustration. Reference numeral 33 designates a head case which includes case side plates 33*a* on the opposite sides as seen in the axial direction. A bearing portion 33*b* for receiving the shaft portion 324*e* of the recording head unit 32 therein and a positioning pin 33*c* are formed on each of the case side plates 33*a*. The positioning pin 33*c* is located at the position where it is engaged with the notch 142*c* of the carrier 14 so as to restrictively prevent the turning movement of the head case 33 with the aid of a clicking action having a predetermined intensity of pressure. Reference numeral 33*d* designates a setting cam which is designed to exhibit a conical shape and disposed at the position where it is engaged with the setting lever 28*c* of the contact lever 28. The setting cam 33*d* is formed only on the right-hand side as seen in the drawing, i.e., on the contact lever 28 side. Reference numeral 33*e* designates a case knob.

The head case 33 is fitted onto the recording head 32 in such a manner as to cover the latter therewith, and this makes it easy to handle the recording head 32 having a cylindrical configuration. Since each of the case side plates 33*a* is dimensioned to have a diameter larger than an outer diameter of the recording head 32 and a flat portion 33*f* is formed on each of the case side plates 33*a*, there does not arise a malfunction that the recording head 32 rolls on the upper surface of a table and the like when it is placed on the table after it is disengaged from the carrier 14.

Referring to FIG. 1 again, reference numeral 34 designates a carrier flexible cable of which one end is fixed to the carrier 14. The carrier flexible cable 34 is electrically connected to the carrier motor 15, the preliminary ejection sensor 29, the contact portion of the contact lever 28, the home position sensor 31 and others. In addition, the carrier flexible cable 34 is electrically connected to a timing pulse detector to be described later. Other end 34*a* of the carrier flexible cable 34 passes through an opening portion 1*e* of the frame 1 so that it is electrically connected to a controlling base board to be described later. Reference numeral 35 designates a timing pulse detector. The timing pulse detector 35 is constructed such that a coil is wound about a core 35*a*. The detector 35 is secured to the carrier 14 such that one end of the core 35*a* is positioned in the vicinity of the magnetizing portion 18*c* of the drive gear 18. As the magnetizing portion 18*c* of the drive gear 18 is rotated, a certain intensity of electromotive force is generated in the coil of the timing pulse detector 35, and subsequently, the electromotive force is subjected to analogue-digital converting to generate a train of timing pulses which in turn is used for drivably controlling the recording head 32. It should be noted that the terminal end of the coil is connected to the inner end of the carrier flexible cable 34.

Figure 7:
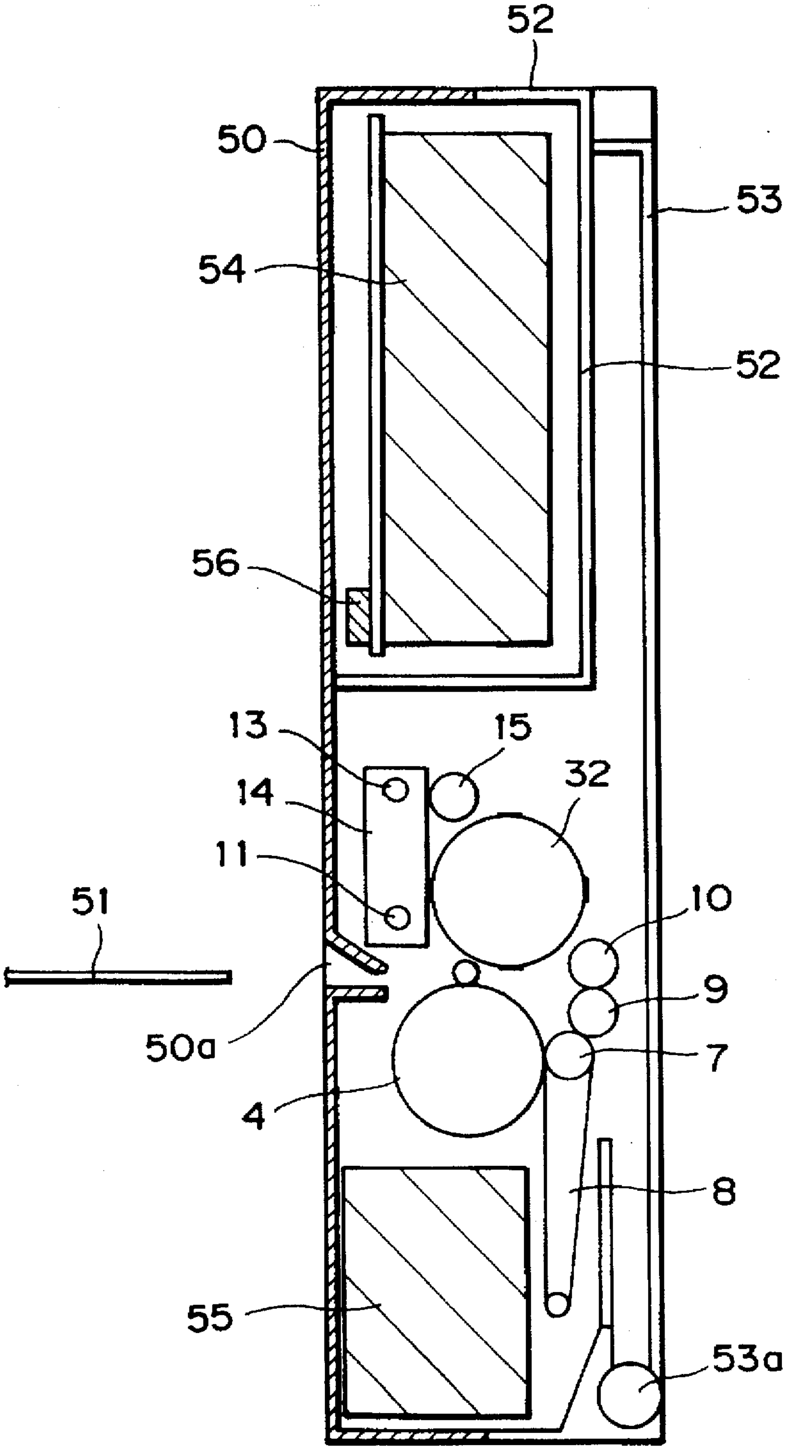
FIG. 7 is a schematic sectional view of the ink jet recording apparatus shown in FIG. 1, showing the arrangement of essential components constituting the ink jet recording apparatus.

FIG. 7 is a sectional view which schematically shows essential components arranged in the interior of the ink jet recording apparatus constructed in accordance with an embodiment of the present invention, and the same components as those shown in FIG. 1 are represented by same reference numerals. Reference numeral 50 designates a lower case. An opening portion 50*a* is formed through the bottom wall of the lower case 50 so as to allow a recording paper sheet 51 to be fed to the interior of the ink jet recording apparatus through the opening portion 50*a*. Reference numeral 52 designates an upper case which is to be combined with the lower case 50. An assembly of the lower case 50 and the upper case 52 combined with each other serves as a box-shaped printer case. Reference numeral 53 designates a cover which is constructed to be immovably held at a predetermined angle in order to exhibit a function as a stacker for stacking sheets one above another every time a recording operation is achieved. Reference numeral 53*a* designates a hinge, and reference numeral 54 designates a controlling circuit board on which various kinds of electrical elements such as a central processing unit (microprocessor), an interface, a memory and others are mounted. Reference numeral 55 designates a battery which makes it possible to construct the ink jet recording apparatus as a portable type so as to enable it to be used at the position where an exterior power source is not available. Reference numeral 56 designates a sensor similar to the previously mentioned preliminary ejection sensor which is mounted on the controlling circuit board 56 in order to detect an exterior noise such as a sound wave or vibrations. Incidentally, it is acceptable that an opening is formed through the lower case 50 at a certain position of the latter so as to allow a sound wave to easily invade in the interior of the ink jet recording apparatus.

Next, a mode of operation of the ink jet recording apparatus constructed in the aforementioned manner will be described below.

In response to a recording operation start command issued from the controlling circuit board 54, first, the carrier motor 15 is rotationally driven, causing the carrier 14 to be displaced in the main scanning direction. At this time, the driving power generated by the carrier motor 15 is transmitted to the drive gear 18 via the carrier motor pinion 16 and the idle gear 17, and as the drive gear 18 is rotated, the engagement portion 18*b* formed on the inner wall surface of the drive gear 18 is caused to move along the lead groove 11*a* of the lead screw 11. Since the opposite ends of the lead screw 11 are fixedly secured to both the frame side plates 1*a* and 1*b* of the frame 1, the drive gear 18 itself is displaced in the main scanning direction without any rotation of the lead screw 11. As the drive gear 18 is displaced in that way, the holder portion 143 is followably displaced together with the drive gear 18 in the same direction, resulting in the carrier 14 being slidably displaced together with the drive gear 18 and the holder portion 143 in the same direction.

When the drive gear 18 is rotationally driven, the magnetizing portion 18*c* of the drive gear 18 is rotated in synchronization with the rotation of the drive gear 18, causing a certain intensity of electromotive force to be generated in the timing pulse generating unit 35. After the electromotive force is transformed into a timing pulse, the latter is inputted into the central processing unit mounted on the control circuit board 54.

Figure 8A:
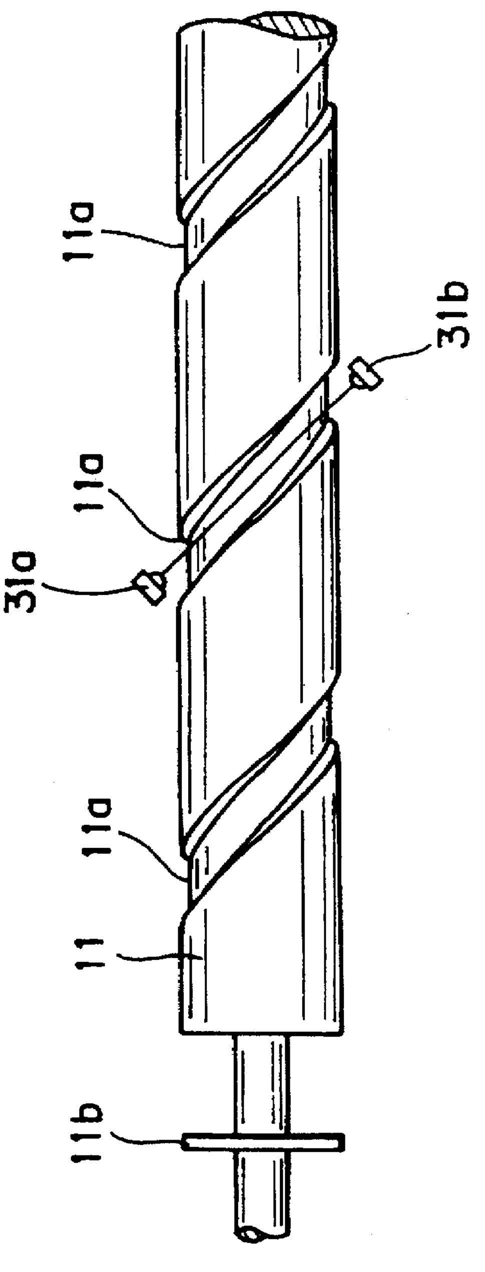
FIG. 8A and FIG. 8B explain the relationship between a series of timing pulses generated from the ink jet recording apparatus shown in FIG. 1 and a plurality of detection outputs obtained from a lead groove spirally formed along a lead screw shown in FIG. 8A)
Figure 8B:
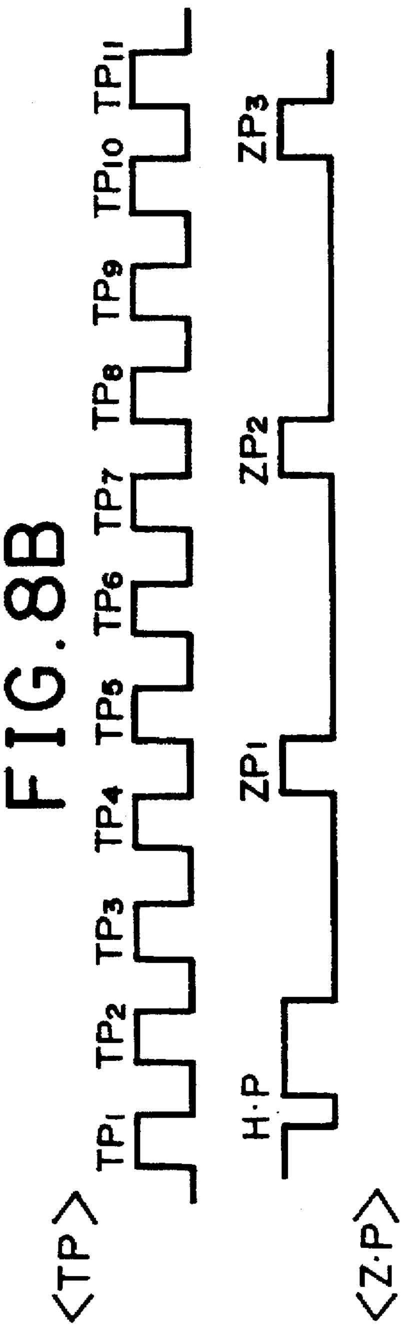

FIG. 8 shows by way of illustrative views the relationship between a series of timing pulses and a plurality of detection outputs obtained from the lead groove 11*a* of the lead screw 11. A series of timing pulses (TP) are generated as the drive gear 18 is rotationally driven in the above-described manner. Thus, if the drive gear 18 is rotated at a constant speed, a series of pulses are outputted with a constant interval between adjacent ones. Since a light beam path of the home position sensor 31 is not interrupted by the lead groove 11*a* of the lead screw 11 regardless of the aforementioned slidable displacement of the carrier 14, an output wave shape as shown in FIG. 8 can be obtained at any position on the lead groove 11*b* of the lead screw 11. Provided that the pitch of the lead groove 11*a* of the lead screw 11 is set to a value as large as integral times the pitch of recording dots, a pulse-like wave shape is obtained every constant number of timing pulses TP. Thus, the home position sensor 31 can be used for detecting a zone in the course of a bidirectional recording operation to be described later. Here, a detection output obtained from the lead groove 11*a* of the lead screw 11 in association with the home position sensor 31 is called a zone pulse ZP.

The circular disc 11*b* disposed on the home position side of the lead screw 11 is dimensioned to have a sufficiently small thickness compared with the width of the lead groove 11*a* of the lead screw 11. Since an optical axis of the home position sensor 31 slantwise extends in the upward/downward direction, the circular disc 11*b* is apparently detected to have a thickness or width larger than the actual width. However, when the thickness of the circular disc 11*b* is adequately determined, a home position signal H.P can be discriminated from the zone pulse without any particular problem.

Referring to FIG. 8 again, the home position signal H.P is detected between timing pulses TP1 and TP2, and subsequently, when the carrier 14 is displaced in the rightward direction, the zone pulse ZP1 is outputted between timing pulses TP4 and TP5. When the carrier 14 is displaced further in the rightward direction, the zone pulse ZP2 is outputted between timing pulses TP7 and TP8 and the zone pulse ZP3 is outputted between timing pulses TP10 and TPll, respectively. As is apparent from the figure, each zone pulse Z.P is outputted at a constant interval. In view of the foregoing fact, it is acceptable that after the home position signal H-P is detected as the carrier motor 15 is rotationally driven, a driving signal is applied to the recording head 32 by using a rising signal of the timing pulse TP5 generated after detection of the zone pulse ZP1, and thereafter, ink is ejected from the recording head 32. In addition, it is acceptable that the number of magnetizing poles in the magnetizing portion 18*c* of the drive gear 18 is increased in order to assure that many timing pulses TP are outputted from the detector 35. Additionally, it is also acceptable that timing pulses obtained by division of an interval between the detected timing pulses are prepared by activating the central processing unit to determine the time when each recording operation is to be triggered. In this embodiment, since each recording operation is performed in response to the timing signal TP outputted from the home position sensor 31 as the carrier 14 is displaced in that way, the ink jet recording apparatus has an advantage that an ink droplet shooting accuracy can be improved compared with an open loop controlling system wherein motor driving and ink ejection are executed by using a reference pulse (in this case, a pulse motor is usually used). In this embodiment, a driving mechanism and a signal outputting mechanism can be constructed to exhibit a common structure not only by immovably holding the lead screw 11 and obtaining a timing output by rotation of the drive gear 18 but also by obtaining a zone signal based on the lead groove 11*a* of the lead screw 11. With this construction, the deviation of each signal from its original position due to vibratively displacement or an inclination of the carrier 14, and deflection of components constituting the foregoing mechanisms can be minimized. In addition, to cope with the malfunction that the output wave shape of a timing signal is disturbed when the slidable displacement of the carrier 14 is reversed in the course of a reciprocal (bidirectional) recording operation, resulting in an exact counting operation failing to be achieved, a series of zone signals ZP are used for the ink jet recording apparatus. In other words, the bidirectional recording operation is performed within the range divisionally defined by the relevant zones, and any reversion is not executed within the range of each zone (defined between adjacent zone pulses ZP). Thus, since a series of timing pulses can exactly be counted after a zone pulse is detected on completion of the reversion of the displacement of the carrier 14, it becomes possible to perform each bidirectional recording operation at a shortest distance based on a zone unit.

Next, a mode of operation to be performed when the recording head 32 is to be fitted onto the carrier 14 will be described below with reference to FIG. 9A to FIG. 9D.

When the recording head 32 is fitted onto the carrier 14 while it is received in the head case 33, the shaft portion 324*e* of the ink tank 324 is received in the carrier 14 from above along grooves 141*a* and 142*a* formed through the carrier side plate A 141 and the carrier side plate B 142 of the carrier 14 while the case knob 33*e* is held above the carrier 14 with user's fingers, whereby the shaft portion 324*e* of the ink tank 324 is rotatably supported in the bearing portions 141*b* and 141*b* of the carrier 14.

Figure 9A:
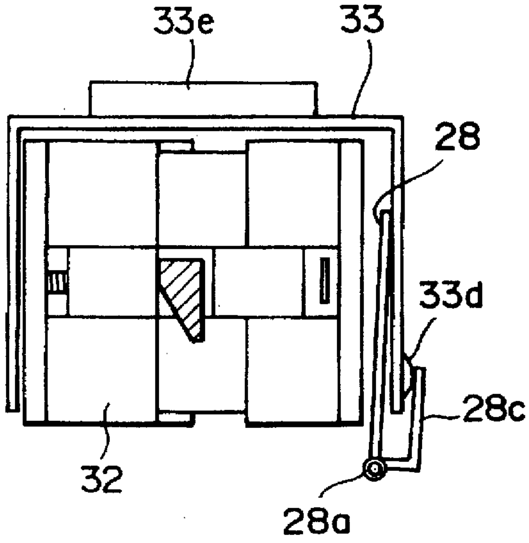
FIG. 9A to FIG. 9D are illustrative views which show a series of fitting operations to be performed for fitting a recording head into the ink jet recording apparatus shown in FIG. 1, respectively.
Figure 9B:
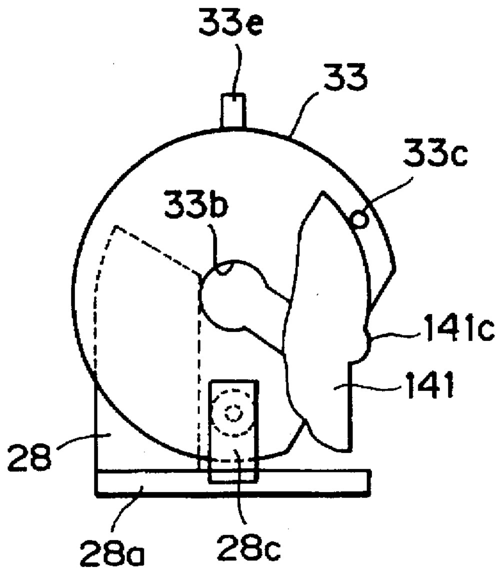
Figure 9C:
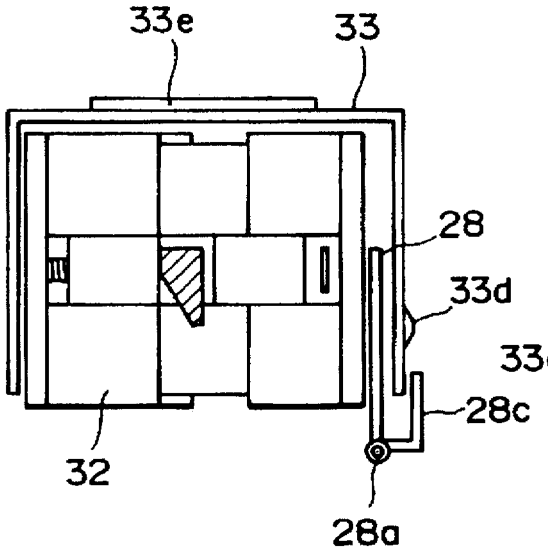
Figure 9D:
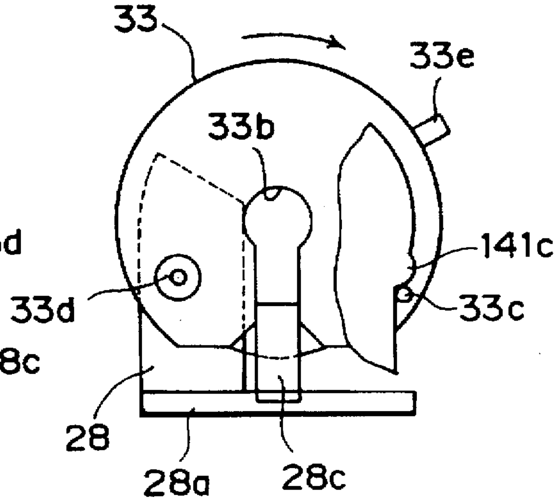

At this time, the setting cam 33*d* formed on the head case 33 is engaged with the setting lever 28*c* made integral with the contact lever 28, and the contact lever 28 turns about the turn shaft 28*a* by a predetermined angle, so that it is released from the contact state with the contact portion 327*b* of the recording head 32 (see FIGS. 9A, 9B). Next, when the head case 33 is turned in the arrow-marked direction shown in FIG. 9D, the setting cam 33*d* is disengaged from the setting lever 28*c*, and subsequently, the contact lever 28 is brought in contact with the contact portions 327*b* of the recording head 32 by the resilient force given by a spring (not shown). This makes it possible to make electrical connection between the recording head 32 and the carrier flexible cable 34. At this time, the positioning pin 33*c* of the head case 33 is engaged with the notch 142*c* of the carrier 14, resulting in further rotating movement of the head case 32 being restrictively limited.

Next, a mode of color changing operation will be described below with reference to FIG. 10A to FIG. 10C as well as FIG. 11A and FIG. 11B.

Figure 10A:
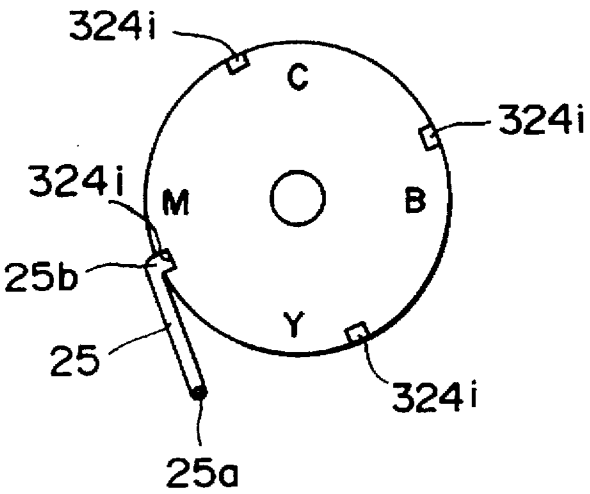
FIG. 10A to FIG. 10C are illustrative views which show a series of operations to be performed for changing the present color used for a color recording operation to be performed by the recording head to other one, respectively.
Figure 10B:
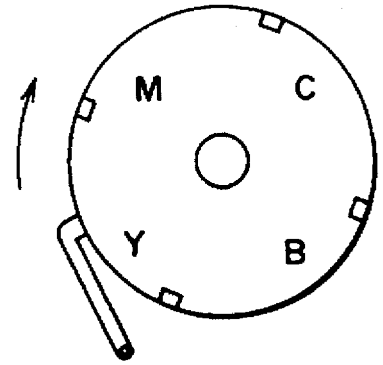
Figure 10C:
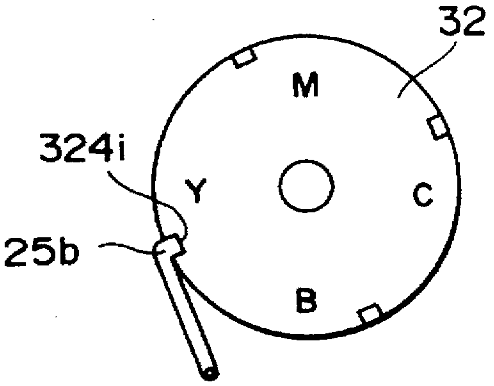
Figure 11A:
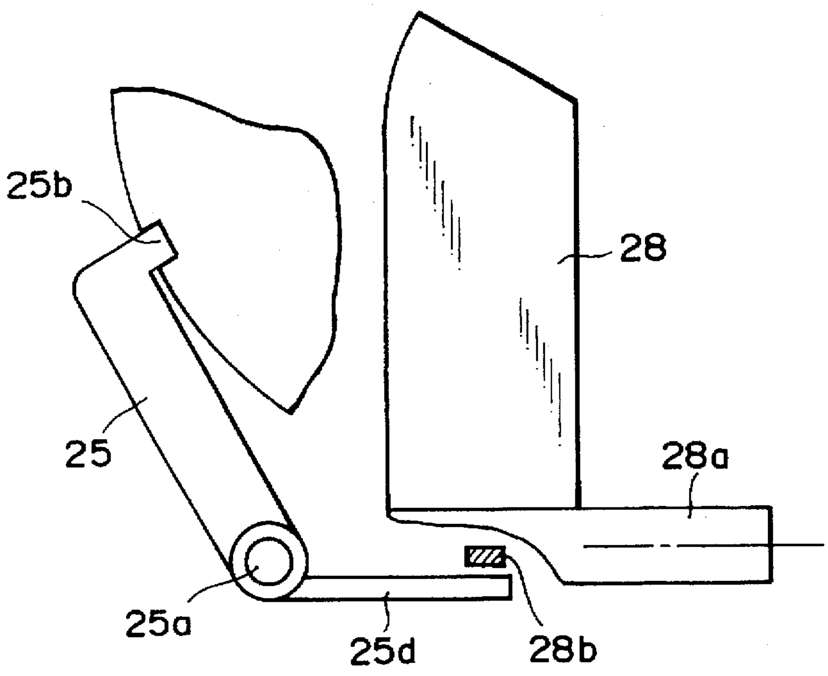
FIG. 11A and FIG. 11B are illustrative views which show operations to be performed for changing the present color used for a color recording operation to be performed by the recording head to another one, respectively

FIG. 10A shows by way of illustrative view the state that a recording paper sheet faces to the head of magenta M on-the recording head unit 32. At this time, the driving force generated by the carrier motor 15 is transmitted to the clutch gear 19 via the carrier motor pinion 16 and the idle gear 17, and subsequently, it is transmitted further to the changing gear 21 via the frictional plate 20, causing the changing gear 21 to mesh with the head gear 324*f* of the recording head unit 32 in order to serve a force effective for rotating the recording head unit 32. However, since the locking portion 25*b* of the changing lever 25 is engaged with the rotational position determining hole 324*i* of the recording head unit 32 at this time, the recording head unit 32 can not be rotated any more. Thus, the driving force is absorbed in the frictional plate 20 in vain as slippage is caused among the clutch gear 19, the frictional plate 20 and the changing gear 21.

Figure 11B:
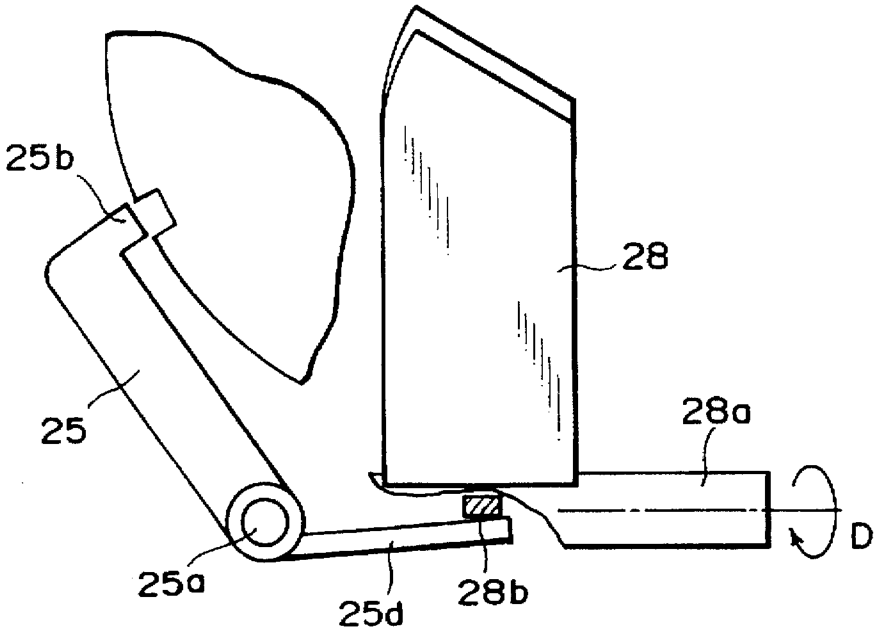

At the time of color changing, while the carrier motor 15 is rotationally driven, the changing solenoid 27 is turned on, causing the changing lever 25 to be turned in the anticlockwise direction as seen in FIG. 11B, whereby the locking portion 25*b* of the change lever 25 is disengaged from the rotational position determining hole 324*i* on the recording head unit 32. Since the driving force generated by the carrier motor 15 is always exerted on the recording head unit 32 in such a direction that the recording head 32 is rotated, the recording head unit 32 is rotated in the arrow-marked direction shown in FIG. 10B. At this time, as shown in FIGS. 11A and 11B, the releasing arm portion 25*d* is turned in the anticlockwise direction as the change lever 25 is turned in that way so that the turn lever 28*b* of the contact lever 28 held in the engaged state till this time is raised up. As shown in FIG. 11B, as the turn lever 28*b* is turned in that way, the contact lever 28 is turned in the D arrow-marked direction so that it is released from the thrusted state that it is thrusted against the contact portions 327*b* on the recording head unit 32. Consequently, the recording head unit 32 can easily be rotated while preventing the contact portions 327*b* thereon from undesirably wearing.

Referring to FIG. 10 again, the recording head unit 32 can continuously be rotated but the changing solenoid 27 may be turned off in the course of the continuous rotation of the recording head 32. When the recording head 32 is rotated to assume a predetermined position, i.e., the position where the recording paper sheet faces to the head of yellow Y of the recording head unit 32, the locking portion 25*b* of the changing lever 25 is engaged with the rotational position determining hole 324*i*, resulting in the rotation of the recording head unit 32 being interrupted.

Next a mode of opening/closing operation of a head cap at the time of color changing will be described below with reference to FIG. 12A to FIG. 12C.

Figure 12A:
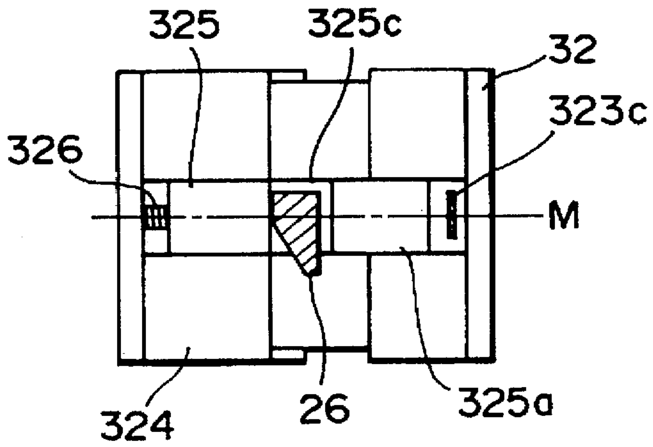
FIG. 12A to FIG. 12C are illustrative views which show a series of operations to be performed for opening and closing a cap disposed in the ink jet recording apparatus shown in FIG. 1, respectively.
Figure 12B:
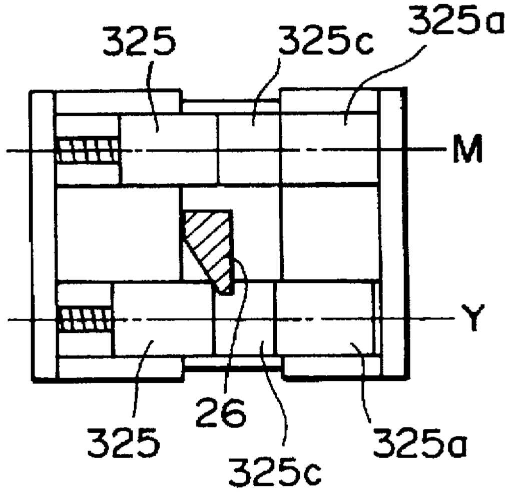
Figure 12C:
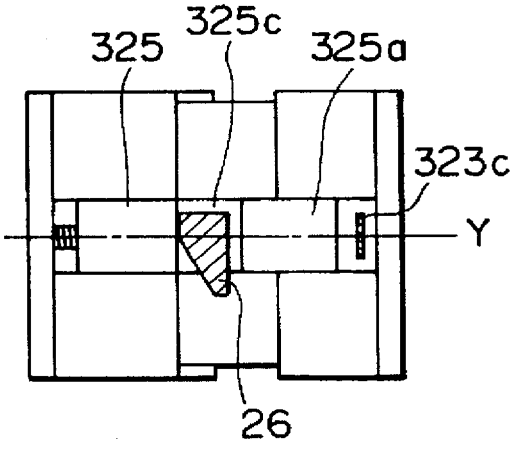

As shown in FIG. 12A, when ink is ejected from one of the head of recording head unit 32, nozzles 323*c* is exposed to the outside and the head cap 325 is kept opened with the aid of the cap lever 26 which has an inclined cam portion and secured to the carrier 14. FIG. 12B shows by way of illustrative view the state that the recording head unit 32 is halfway rotated for he purpose of color changing so that the head of magenta M and the head of yellow Y are capped with head cap 325. When the recording head unit 32 is rotated further, the inclined cam portion of the cap lever 26 is engaged with the actuating groove 325*c* of the head cap 325, and subsequently, as the recording head 32 is rotated, the head cap 325 is gradually opened. When a next head portion of the recording head unit 32 (in the shown case, the head of yellow Y) faces to the recording paper sheet, the head cap 325 is completely opened (see FIG. 12C). It is acceptable that selection of a color to be used for a color recording operation is made by utilizing discrimination contacts each disposed in the contact portion 327*b* on the recording head unit 32 corresponding to each color. Alternatively, the foregoing section may be made by utilizing a single discrimination contact disposed in the contact portion 327*b* of the same and then successively counting the number of head portions as the recording head unit 32 is rotated.

At the time of color changing, a head of the recording head unit which has not been used directly before the desired color changing is used. For this reason, it is preferable that a certain quantity of ink having an increased viscosity is discharged so as to allow the head to be next used to assume an excellent ink ejecting state. This is accomplished by executing ink ejection in the entirely same manner as the aforementioned recording operation toward the preliminary ink ejection sensor 29 located opposite to the position where the head cap 325 is opened during rotation of the recording head unit 32. It should be noted that it is sufficient that at least the nozzle portion is opened, and at this time, it is not necessary that the head cap 325 is completely opened.

Figure 13A:
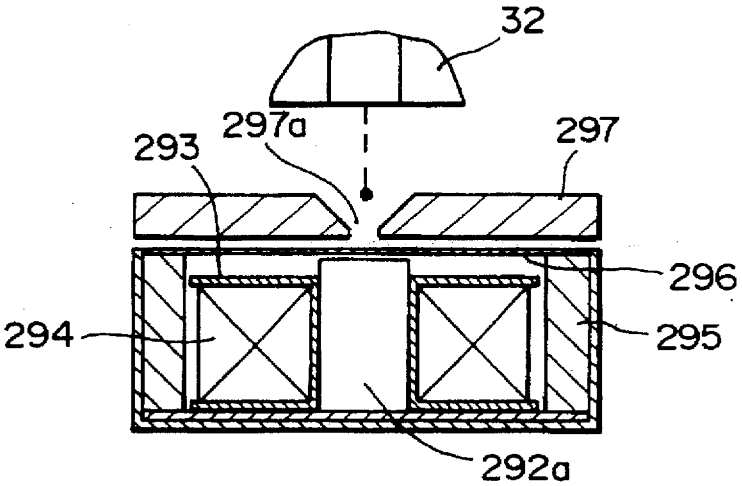
FIG. 13A to FIG. 13C are illustrative views which show a series of operations to be achieved for discharging ink having an increased viscosity when the present color used for a color recording operation to be performed by the recording head is changed to another one, respectively.
Figure 13B:
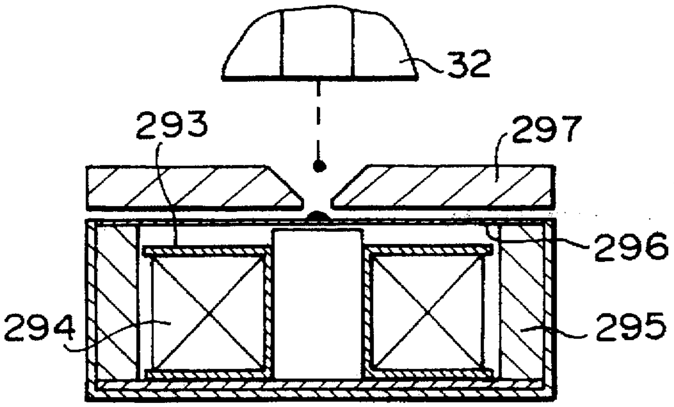
Figure 13C:
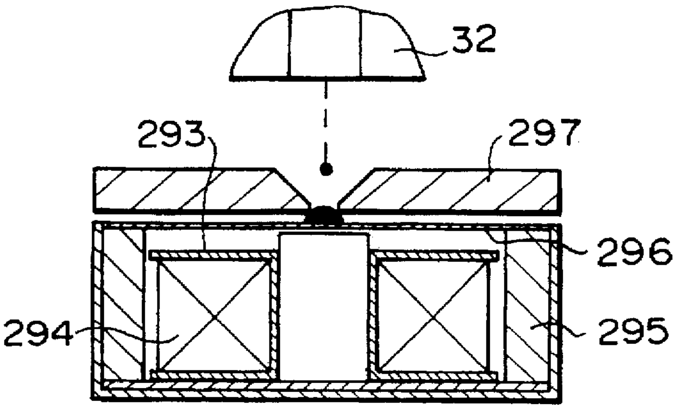

FIG. 13A to FIG. 13C show by way of sectional views a series of ink ejections. An ink droplet ejected from the recording head 32 flies in the air, passes through an opening portion 297*a* of a preliminary ejection absorbing member 297, and finally, collides against the vibration plate 296. 0n the collision of the ink droplet against the vibration plate 296, the vibration plate 296 is vibrated, causing the gap of a magnetic circuit in the preliminary ejection sensor 29 to vary. This leads to the result that a certain intensity of electromotive force is generated in the coil 294. A plurality of preliminary ejections are sequentially executed by the same times as the number of nozzles, and when it is confirmed after completion of the ink ejection executed by a predetermined number of two to 10 times that ink droplets are shot onto the vibration plate 296, the program goes to a next nozzle. Thus, useless ink consumption can be prevented. As shown in FIG. 13C, when a quantity of ejected ink exceeds a predetermined one, an extra quantity of ink is absorbed in the preliminary ejection absorbing member 297 on appearance of a capillary phenomenon, resulting in a quantity of ink remaining on the vibration plate 296 being restrictively limited.

Figures 14A, 14B, 14C, 14D, 14E, 14F:
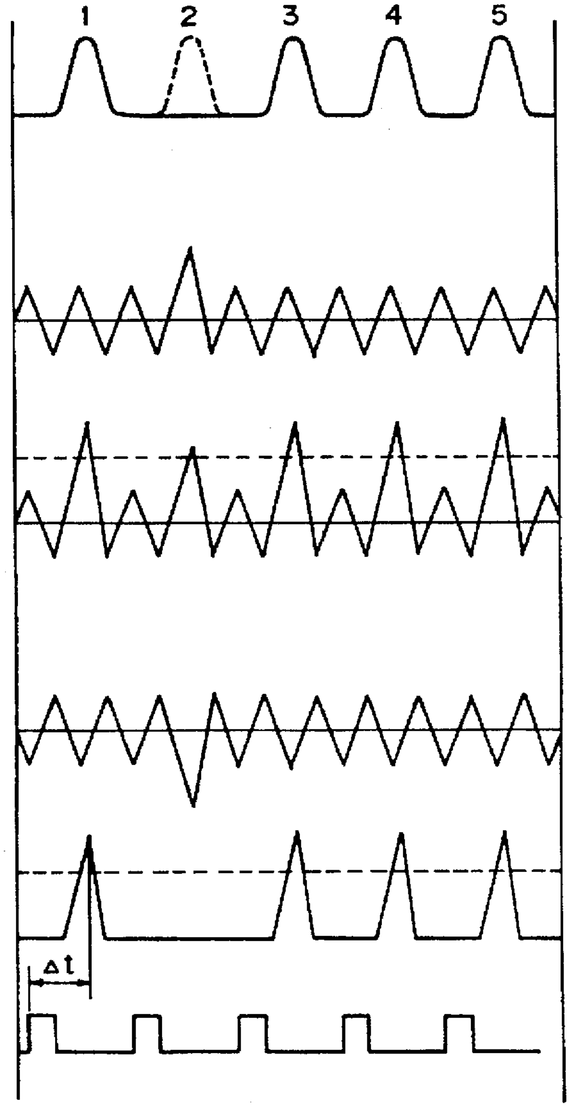
FIGS. 14A to 14F are illustrative views showing a plurality of wave shapes each representing an output from the preliminary ejection sensor; a waveform representing exterior noise; a composite output from the preliminary ejection sensor; a waveform representing a cancel sensor output; a second composite output; and a sequence of reference pulses, respectively.

Next, a plurality of wave shapes each representing an output from the preliminary ejection sensor 29 will be explained below with reference to FIG. 14.

The shape representing a wave outputted from the preliminary ejection sensor 29 after ejection of ink while the recording head 32 is turned on refers to a sensor output. In the shown case, it is assumed that a second nozzle does not output any ink ejection (in other words, ink can not be ejected from the second nozzle). However, a possible sensor output from the second nozzle which can eject normally is schematically shown by a dotted line in the figure.

The ink jet recording apparatus has a problem that the vibration plate 296 may readily detect exterior noise, i.e., sound wave, vibration and similar ones which in turn are outputted therefrom as exterior noise. Since a practical output from the preliminary ejection sensor 29 is illustrated in the form of a composite output 1, in the case that a high output part of the exterior noise unexpectedly coincides with the frequency of each preliminary ejection for some reason, there is a fear that the vibration plate 296 picks up noise even though a threshold is set to assume a high level in order to cut off any noise having a low output, resulting in the fact that ink ejection from the second nozzle is not practically executed failing to be detected. To avoid an occurrence of the foregoing malfunction, it is advantageously acceptable that a series of cycles are repeated several times or ink is ejected from a single nozzle several times or the frequency of ink ejection from the recording head is changed to another one in order to avoidably prevent the frequency of ink ejection from being synchronized with that of exterior noise (e.g., in the case of a recording head having an ejection frequency of 4 kHz, preliminary ejection is executed by way of three stages of 3.5 kHz, 3.7 kHz and 4 kHz).

On the other hand, there is a possibility that two preliminary ejection sensors 29 are disposed, one of them being adapted to detect only exterior noise (e.g., they may be mounted on the controlling circuit board for the ink jet recording apparatus in order to easily perform a wiring operation), an output wave shape from one preliminary sensor 29 is processed and then reversed, and finally, the reversed output wave shape is synthesized with an output from the other preliminary ejection sensor 29 as a cancel sensor output, resulting in a composite output 2 being obtained. At this time, since the carrier 14 is not displaced, no timing pulse is outputted from the timing pulse detector 35 as a reference pulse. In view of the foregoing fact, there is a possibility that not only the presence or absence of ink ejection but also an ink ejection speed can be detected by measuring a time $\Delta t$ that elapses from a reference pulse to a sensor output (composite output 2), with the aid of the central processing unit. In this case, since the reference pulse can be produced by utilizing the central processing unit, it is possible to detect incorrect shooting of ink droplets onto the recording paper sheet for forming a dot therewith as well as deviation of the shooting direction from a proper one without any deterioration of a quality of each recorded image.

With respect to a nozzle from which no ink is ejected, there is a possibility that a recovering operation is performed for the nozzle by repeatedly applying an ejection pulse to the nozzle until ink is ejected therefrom or by applying an intentionally low frequency pulse or a long pulse to the nozzle without any ink sucking operation achieved as far as possible.

In this embodiment, preliminary ejection is executed in the course of an ink changing operation, and after the ink ejecting state is checked on the nozzle, a recording operation is performed with a next kind of ink. Provided that a measure is taken such that dot image data are transferred from the host computer (i.e. on information on respective colors (i.e., yellow, magenta, cyan and black), it is sufficient that a line buffer for a printer has the same capacity as that of a monochromatic ink jet recording apparatus. In addition, since a recording/controlling operation is achieved without any variation from an ordinary monochromatic recording operation (e.g., black color only), the color ink jet recording apparatus can be handled in the same manner as the monochromatic ink jet recording apparatus.

Next, a mode of recording paper sheet conveying operation to be performed in the course of a recording operation or after completion of the recording operation will bee described below with reference to FIG. 15A to FIG. 15C.

Figure 15A:
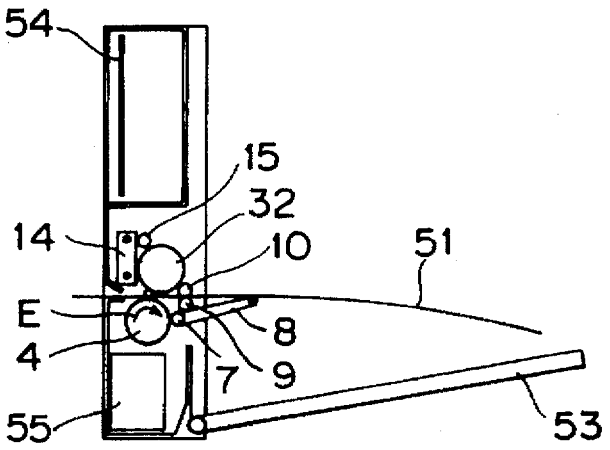
FIG. 15A to FIG. 15C are illustrative views which show operations to be performed for conveying a recording medium during a recording operation or after completion of the recording operation, respectively.

FIG. 15A shows by way of illustrative view the state of the ink jet recording apparatus during a recording operation. A recording paper sheet 51 is conveyed through the ink jet recording apparatus in the substantially horizontal direction, and the recording head 32 ejects ink toward the recording paper sheet 51 in the downward direction to perform a recording operation. At this time, the paper conveying roller 4 is rotated in the clockwise direction as seen in the drawing (i.e., in the E arrow-marked direction, and the power transmitting rollers 7 are rotated in the anticlockwise direction. The paper discharging supporters 8 are turned about the power transmitting rollers 7 in the same direction as that of the power transmitting rollers 7 with frictional force but they collide against position determining members (not shown) so that they are immovably held at predetermined positions. These predetermined positions are located on a tangential line of the recording paper sheet 51 conveyed outside of the ink jet recording apparatus or they are located slightly above the foregoing tangential line so that the foremost end of the sheet 51 does not come in contact with the recording paper sheets 51 which has been precedently stacked on the cover 53 after completion of a-preceding recording operation.

Figure 15B:
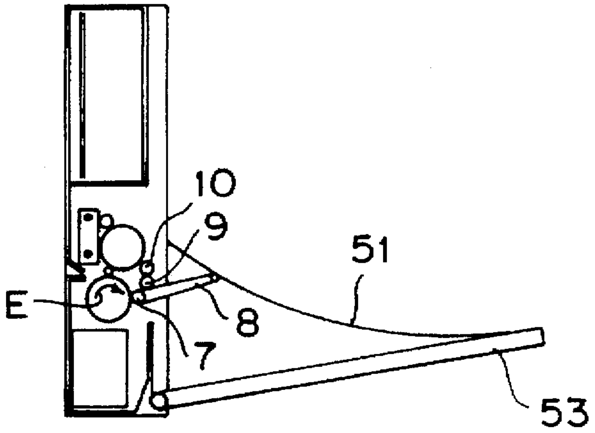

As shown in FIG. 15B, when the recording paper sheet 51 is completely discharged from the paper discharging rollers 9 after completion of the recording operation, the discharging movement of the recording paper sheet 51 is stopped while the rear end part of the recording paper sheet 51 is largely concavely bent in the upward direction.

Figure 15C:
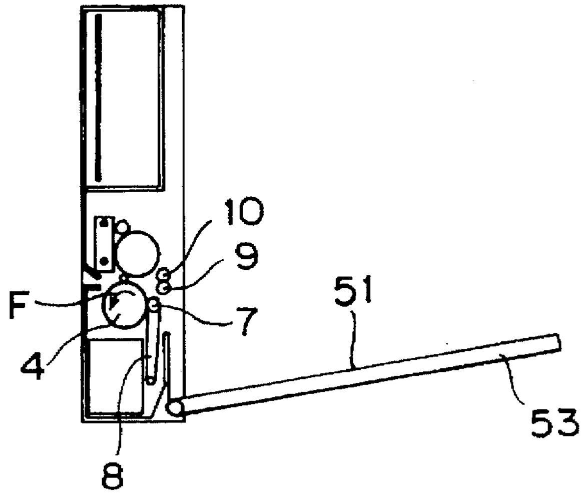

As shown in FIG. 15C, when the paper conveying roller 4 is rotated in the anticlockwise direction (i.e., in the F arrow-marked direction), the power transmitting rollers 7 are rotated in the clockwise direction, and the paper supporters 8 are turned also in the clockwise direction until they are received in the upper case 52. On reception of the supporters 8, the rear end part of the recording paper sheet 51 is placed on the cover 53 in such a manner that the recording paper sheet 51 is stacked on the previous one. Since the paper conveying roller 4 is rotated in the anticlockwise direction after completion of the recording operation, there does not arise any particular problem. In the case that the paper conveying motor 6 serves to generate a certain intensity of force required by an automatic sheet feeder (not shown), there often arises an occasion that the paper conveying roller 4 is rotated in the reverse direction to serve as a trigger. Since useless time loss is not caused at this time, a throughput of the ink jet recording apparatus is not deteriorated.

Next, the structure of a recording head constructed in accordance with this embodiment will be described below.

Figure 16A:
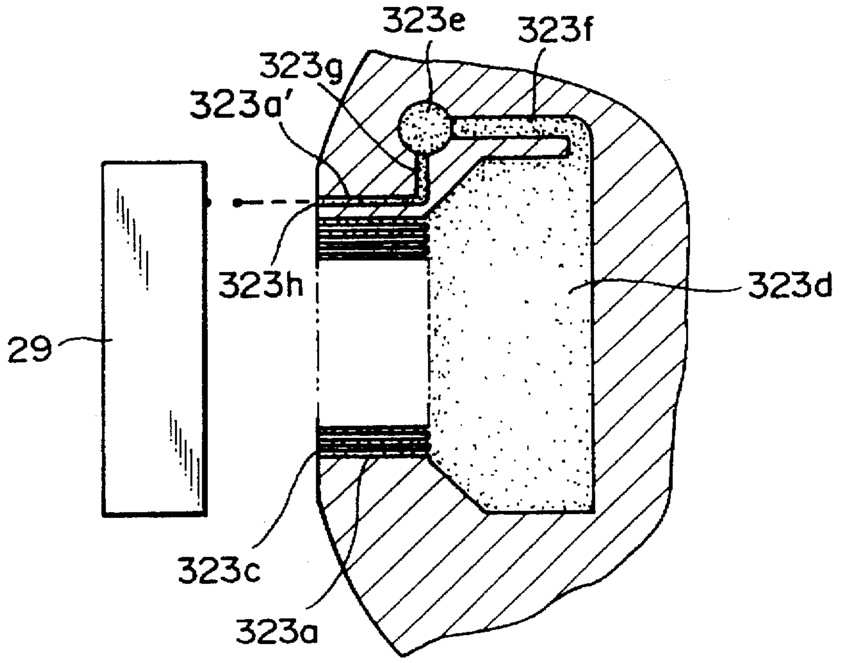
FIG. 16A and FIG. 16B are fragmentary enlarged sectional views which illustratively show the structure of the recording head employed for the ink jet recording apparatus as well as an operation to be performed for detecting a quantity of ink remaining in the recording head, respectively.
Figure 16B:
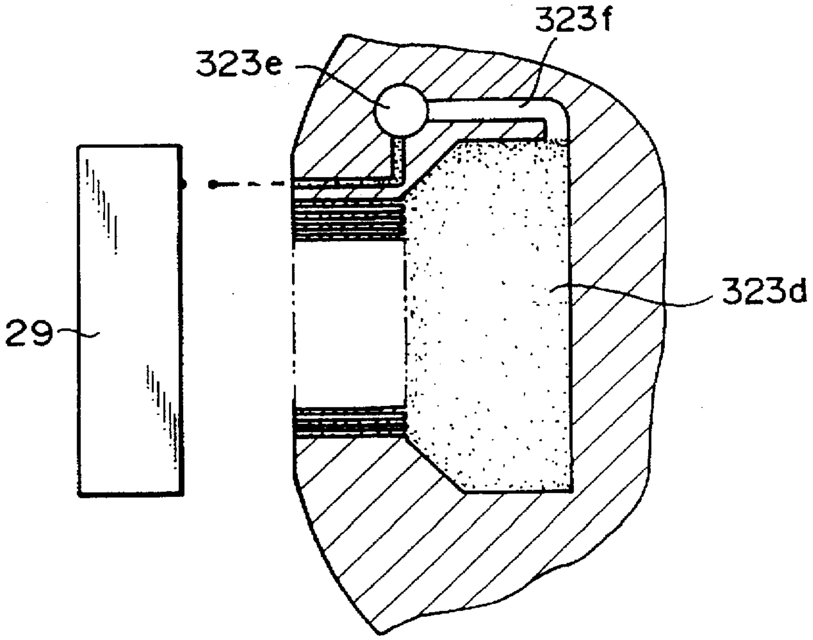

FIG. 16A and FIG. 16B are fragmentary enlarged sectional views which illustratively show the structure of the recording head, respectively. In the drawings, reference numeral 323*f* designates an ink flow path which is formed in the grooved ceiling plate 323. As ink flows through the ink flow path 323*f* via an ink introduction portion 323*e*, it is introduced into the common liquid chamber 323*d*. When a predetermined quantity of ink is accumulatively stored in the common liquid chamber 323*d*, ink is fed to a plurality of liquid paths 323*a*. A plurality of heating elements are arranged on the surface of the head tip 322 facing to the liquid paths 323*a*, and as the heating elements are turned on, gas bubbles are produced in ink, causing the ink to be ejected from a plurality of nozzles 323*c* communicated with the liquid paths 323*a*.

On the other hand, a bypass flow path 323*g* is formed in the grooved ceiling plate 323 while it is branched from the ink introduction portion 323*e*. The bypass flow passage 323*g* serves to feed ink to a remaining ink quantity detecting nozzle (hereinafter referred to as a remaining ink detecting nozzle) 323*h* via a liquid path 323*a* '. A heating element is disposed corresponding to the liquid path 323*a*' so as to enable ink to be ejected also from the remaining ink detecting nozzle 323*h*. Such a recording head including the remaining ink detecting nozzle 323*h* in that way can be produced by way of the substantially same production steps as those of a conventional recording head by simultaneously forming the liquid path 323*a* and the liquid path 323*a*'.

An operation for detecting a quantity of remaining ink will be described below with reference to FIG. 16A and FIG. 16B.

First, the present ink ejecting state of each of the aforementioned nozzles is checked by executing preliminary ejection. When it is found as a result derived from the foregoing checking that the respective nozzles are held in a good ink ejecting state, a quantity of remaining ink is detected. In this case, a quantity of ink equal to a sum of the volume of the bypass flow path 323*g* and the volume of the liquid path 323*a*' is ejected from the remaining ink detecting nozzle 323*h*. For example, when it is assumed that the liquid path 323*a*' is dimensioned to have a square size of 0.04 mm and a length of about 0.2 mm and the bypass flow path 323*g* is dimensioned to have a square size of 0.04 mm and a length of about 1 mm, a volumetric capacity of preliminary ejection to be executed amounts to $1.92\times10^{-6}$ cc. On the other hand, provided that a quantity of ink to be ejected per each driving pulse is set to $7\times10^{-8}$ cc, the ink remaining in the bypass flow path 323*g* and the liquid path 323*a*' is consumingly ejected from the remaining ink nozzle 323*h* by executing ejection driving by plural times corresponding to about 27 pulses. In practice, if it can be confirmed by the preliminary ejection sensor 29 that ink droplets are shot onto the preliminary ejection sensor 29 from the remaining ink detecting nozzle 323*h* by ejecting a quantity of ink slightly larger than the foregoing total volumetric capacity, it is determined that the ink introduction path 323*e* is fully filled with ink. On the contrary, when no ink is present in the ink introduction path 323*e* as shown in FIG. 16B, ink droplets are not shot onto the preliminary ejection sensor 29 after the ink remaining in the bypass flow path 323*g* is completely consumed. Thus, this makes it possible to determine that no ink is present in the ink introduction path 323*e* and associated components. Once it is determined that no ink is present in the ink introduction path 323*e* and associated components, it is sufficient that alarming means such as a lamp, a buzzer or the like is activated in order to promote ink supplement. Also in the case that no ink remains in the ink tank 324 but a small quantity of ink remains in the ink introduction path 323*e*, it is determined that some quantity of ink is present in the recording head 32. To cope with the foregoing problem, it is recommendable that the total volumetric capacity of the common liquid chamber 323*d* and the flow path 323*f* is determined in such a manner as to allow a quantity of ink corresponding to at least one line to be recorded to be reserved in the recording head 32, and subsequently, remaining ink quantity detection is executed per each line. Consequently, there does not arise any particular problem.

Other embodiments)

An ink jet recording apparatus constructed in accordance with each of other embodiments of the present invention will be described below with reference to FIG. 17, FIG. 18, FIGS. 19 to 21, FIG. 22, FIGS. 23 and 24 and FIGS. 25 to 28.

Figure 17A:
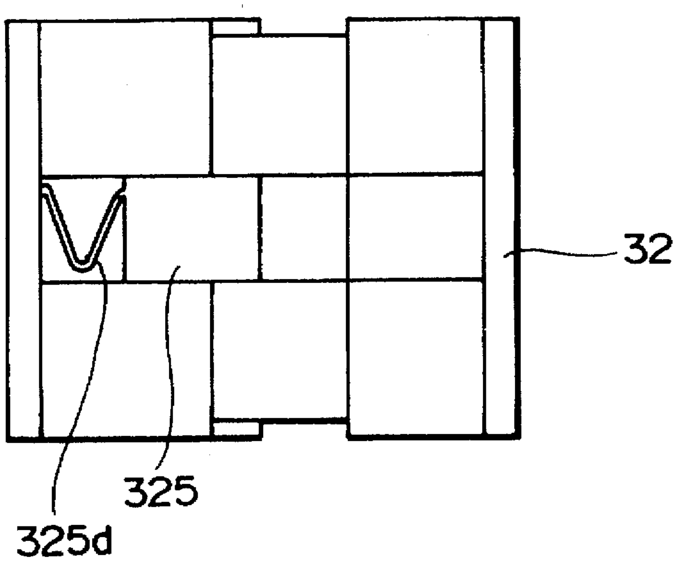
FIG. 17A and FIG. 17B are illustrative views which show the structure of a head cap for an ink jet recording apparatus constructed in accordance with a second embodiment of the present invention as well as an operation to be performed by the head cap, respectively.
Figure 17B:
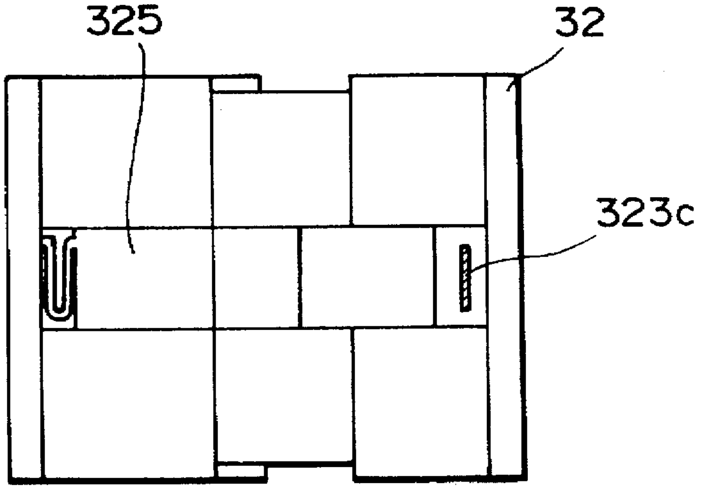

FIG. 17A and FIG. 17B are illustrative views which shows the structure of a head cap mechanism for an ink jet recording apparatus constructed in accordance with a second embodiment of the present invention, respectively. In this embodiment, a recording head unit 32 includes a leaf spring which is formed integral with a cap 325. As is best seen in FIG. 17B, the leaf spring 325*d* is deformably received in the recording head unit 32 adjacent to the cap 325 to exhibit a U-shaped contour. In this case, it is preferable that the cap 325 including the spring 325*d* is molded of an elastic synthetic resin having a few creeping property, e.g., polyacethal resin, nylon resin or the like.

Figure 18A:
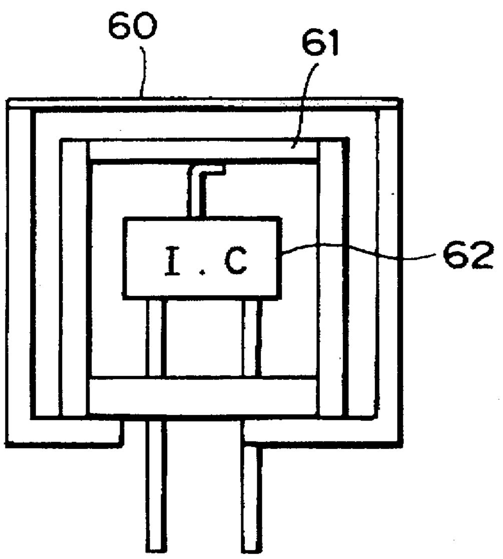
FIG. 18A is a sectional view of a preliminary ejection sensor for an ink jet recording apparatus constructed in accordance with a third embodiment of the present invention.
Figure 18B:
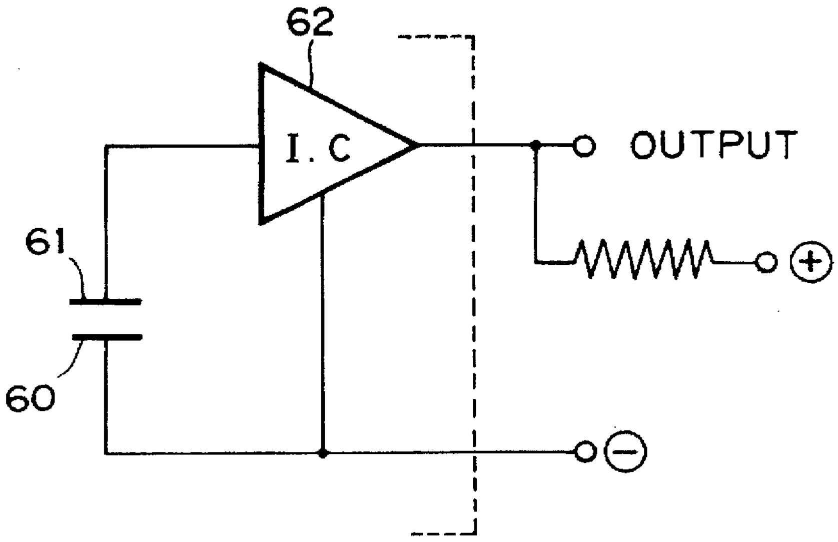
FIG. 18B is a circuit diagram employed for the preliminary ejection sensor shown in FIG. 18A.

FIG. 18A is a sectional view of a preliminary ejection sensor for an ink jet recording apparatus constructed in accordance with another embodiment of the present invention, and FIG. 18B is a circuit diagram for the preliminary ejection sensor shown in FIG. 18A. In this embodiment, the preliminary ejection sensor 29 includes a vibration plate 60 which is formed such that a thin film of aluminum is vapor deposited on a substrate of elastic synthetic resin and an electric conductive plate 61 disposed inside of the vibration plate 60 constitutes a capacitor in cooperation with the vibration plate 60. Variation of an electrostatic capacity of the capacitor induced by vibration of the vibration plate 60 is amplified by an integrated circuit 62, and subsequently, outputted therefrom. In practice, the preliminary ejection sensor is constructed in the substantially same manner as a condenser type microphone. Since it is sufficient that the preliminary ejection sensor has a narrow response frequency range and it can detect shock which arises when an ink droplet is shot onto the vibration plate 60, it is possible to use a vibration plate having a thickness of several hundred microns.

Figure 19:
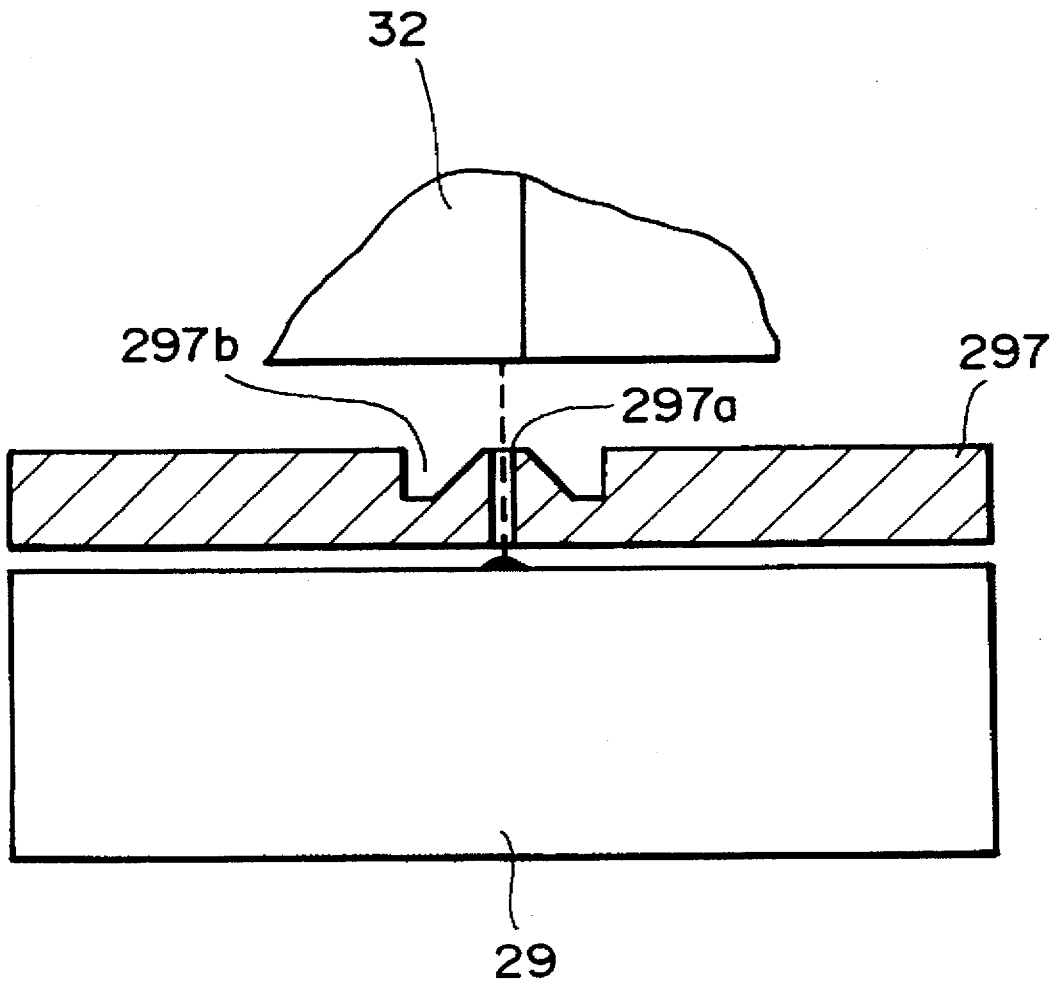
FIG. 19 is a sectional view of a preliminary ejection sensor for an ink jet recording apparatus constructed in accordance with a fourth embodiment of the present invention, showing the structure of the preliminary ejection sensor and associated components located peripheral to the preliminary ejection sensor.

FIG. 19 is a sectional view of associated components located adjacent to a preliminary ejection sensor constructed in accordance with another embodiment of the present invention. The preliminary ejection sensor 29 includes a preliminary ejection absorbing member 297 molded of a porous material having an excellent ink absorbing property, and an opening portion 297*a* of the preliminary ejection absorbing member 297 is formed in the shape of a straight slit without any chamfering given thereto. In this connection, it is recommendable that reference is made to FIG. 13 which shows that an opening portion 297 of the preliminary ejection absorbing member 297 is chamfered. In contrast with the preliminary ejection sensor shown in FIG. 13, with this construction, ink absorbing ability of the ink ejection absorbing member 297 in the vicinity of the opening can be improved, and moreover, any inclination of the ink ejecting direction (i.e., deviation of the ink ejecting direction from a predetermined one) can easily be detected by escapably orienting an ink droplet ejected from the recording head 32 to the outer groove 297*b* side.

Figure 20A:
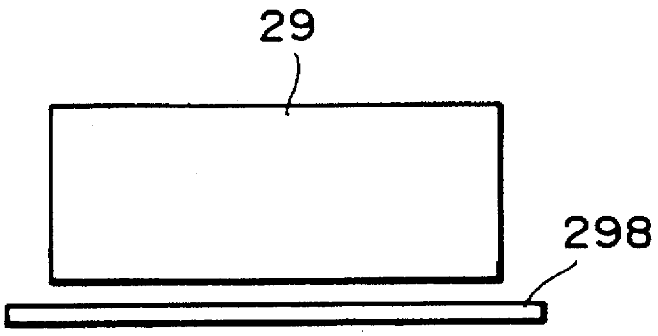
FIG. 20A is a front view of a preliminary ejection sensor for an ink jet recording constructed in accordance with a fifth embodiment of the present invention.
Figure 20B:
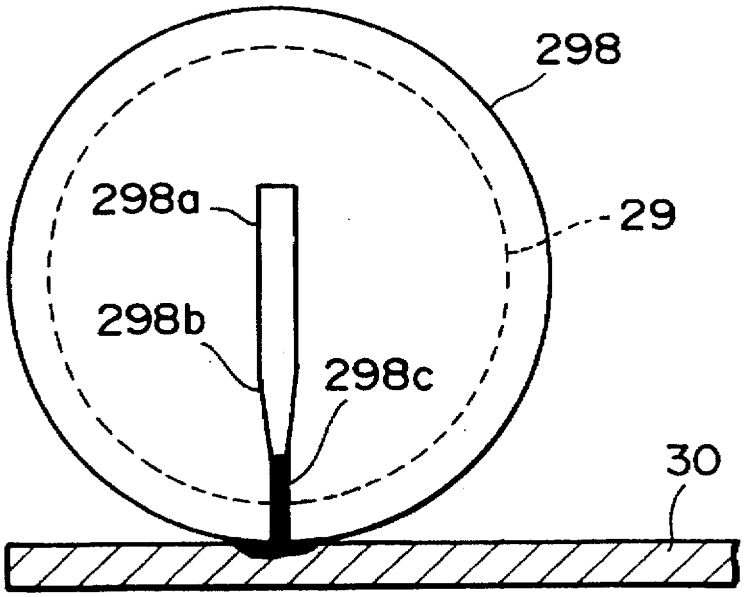
FIG. 20B is a plan view of the preliminary ejection sensor shown in FIG. 20A and an associated component disposed adjacent to the preliminary ejection sensor.

FIG. 20A is a front view of the vicinity of a preliminary ejection sensor for an ink jet recording apparatus constructed in accordance with another embodiment of the present invention, and FIG. 20B is a bottom view of FIG. 20A. In the figures, reference numeral 298 designates an ink removing plate which is made of an ordinary structural material such as metallic material, synthetic resin or the like. A slit-shaped opening portion 298*a* is formed through the ink removing plate 298 at the central part of the latter in order to receive therein the ink preliminarily ejected from the recording head 32. In addition, a tapered slit 298*b* extending from the slit-shaped opening portion 298*a* and a small slit 298*c* closely associated with a carrier absorbing member 30 are formed in the ink removing plate 298. With this construction, an ink droplet shot onto the vibration plate 296 is absorbed in the carrier absorbing member 30 disposed below the small slit 298*c* of the ink removing plate 298 on appearance of a capillary phenomenon. In accordance with this embodiment, since the ink removing plate 298 can be produced by using an inexpensive material compared with the preliminary ejection absorbing member 297 in the preceding embodiment, the ink jet recording apparatus can be provided at a substantially reduced cost.

Figure 21:
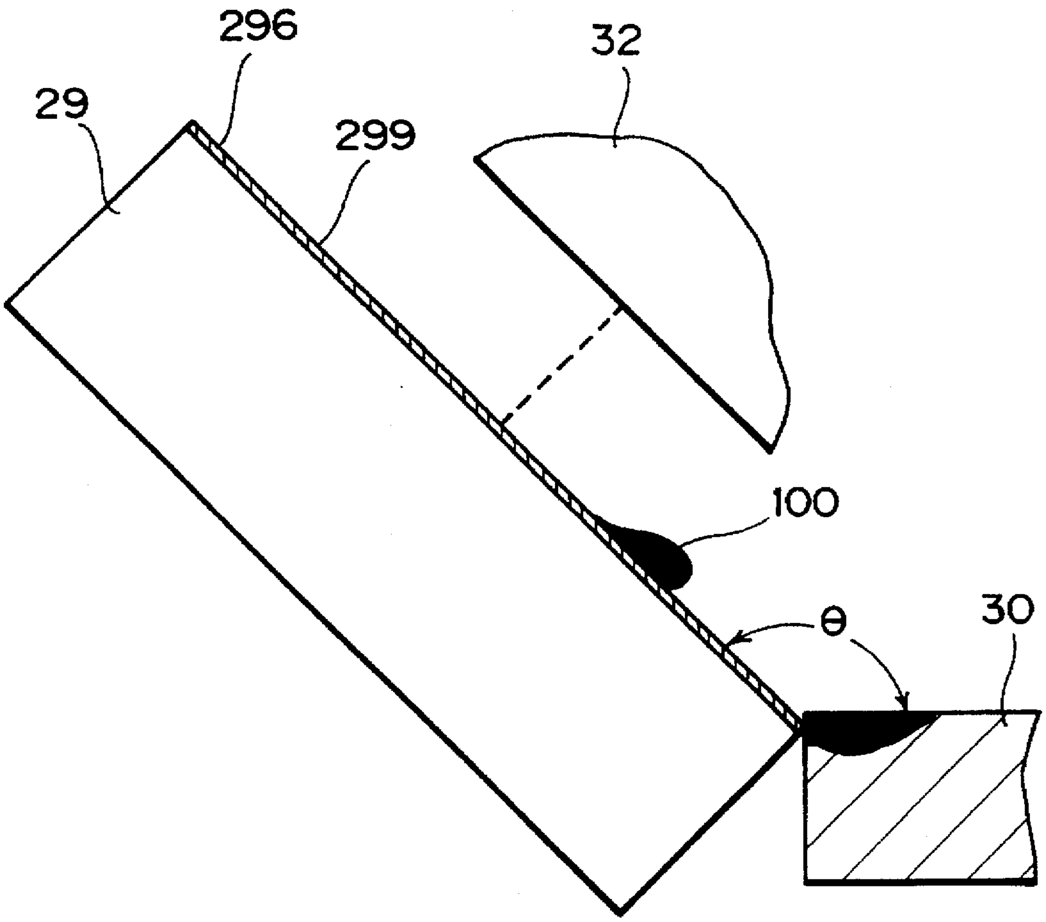
FIG. 21 is a side view of a preliminary ejection sensor for an ink jet recording apparatus constructed in accordance with a sixth embodiment of the present invention.

FIG. 21 is a side view of the vicinity of a preliminary ejection sensor for an ink jet recording apparatus constructed in accordance with still another embodiment of the present invention. The preliminary ejection sensor 29 includes a vibration plate 296 of which surface is coated with a layer of water repelling agent 299 (fluororesin or the like) so as to allow an ink droplet shot onto the vibration plate 296 to slantwise flow in the downward direction. On completion of the downward flowing of the ink droplet in that way, the ink is absorbed in a carrier absorbing member 30. At this time, the vibration plate 296 is arranged at a predetermined angle θ relative to a horizontal line, and this angle θ is adequately determined depending on a water repelling property of the vibration plate 296. Incidentally, the vibration plate 296 itself may be molded of a water repelling material.

Figure 22:
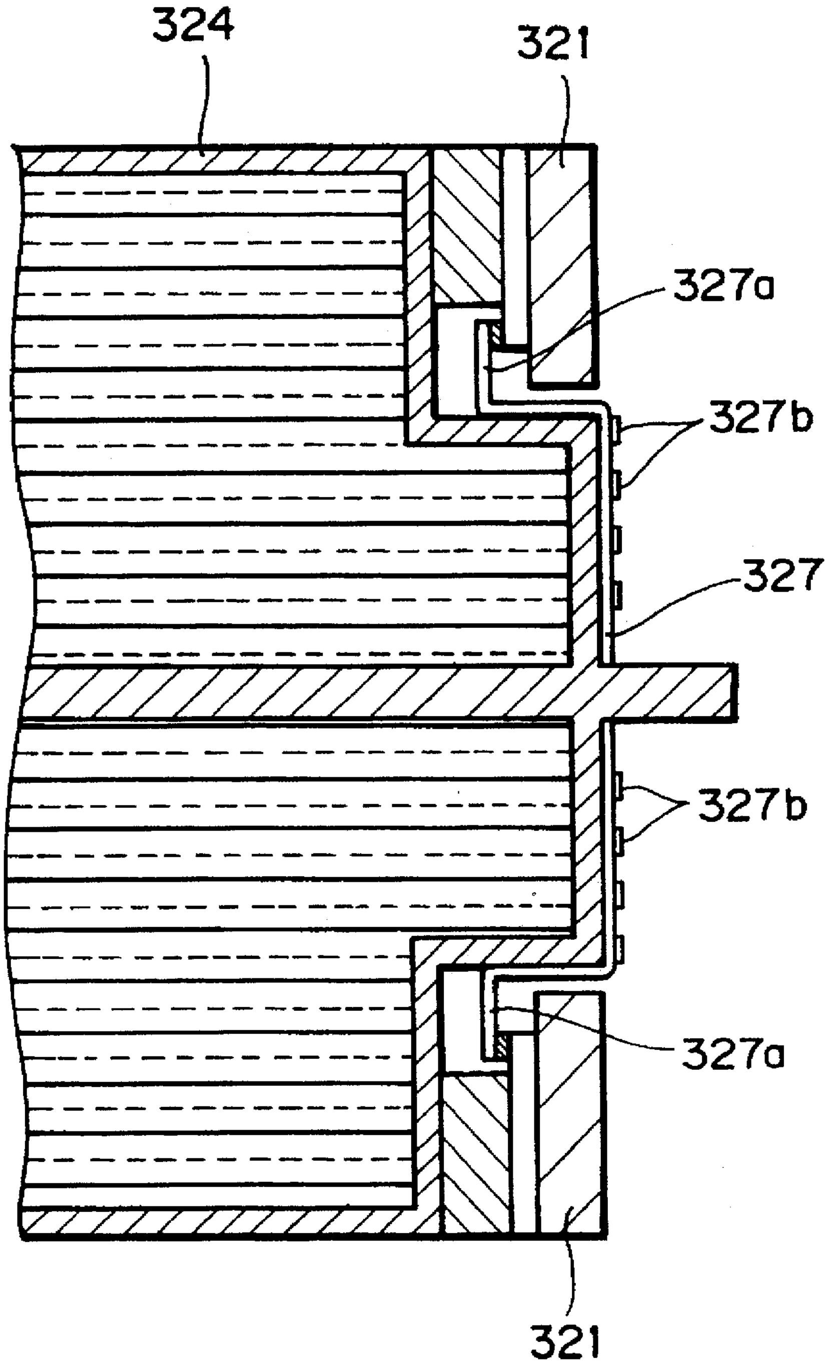
FIG. 22 is a fragmentary enlarged sectional view of a flexible wiring plate fitting portion for an ink jet recording apparatus constructed in accordance with a seventh embodiment of the present invention wherein a plurality of contacts are distributively arranged on a flexible wiring plate as shown in FIG. 2.

FIG. 22 is a fragmentary enlarged sectional view of a flexible wiring plate fitting portion for an ink jet recording apparatus constructed in accordance with another embodiment of the present invention. In this embodiment, the central part of a base plate 321 is largely opened compared with the structure of the base plate shown in FIG. 6, and the right-hand end surface of an ink tank 324 is projected in the rightward direction so that it is flush with the outer surface of the base plate 321. A flexible wiring plate 327 having a plurality of contacts distributively arranged thereon is tightly fitted to the right-hand end surface of the ink tank 324. With this construction, when the flexible wiring plate 327 is assembled with the recording head unit, there does not arise a necessity for allowing the flexible wiring plate 327 to pass through the opening portion of the base plate 321 as explained above with reference to FIG. 6. Consequently, the recording head unit for the ink jet recording apparatus can be assembled with the flexible wiring plate 327 at high efficiency.

Figure 23A:
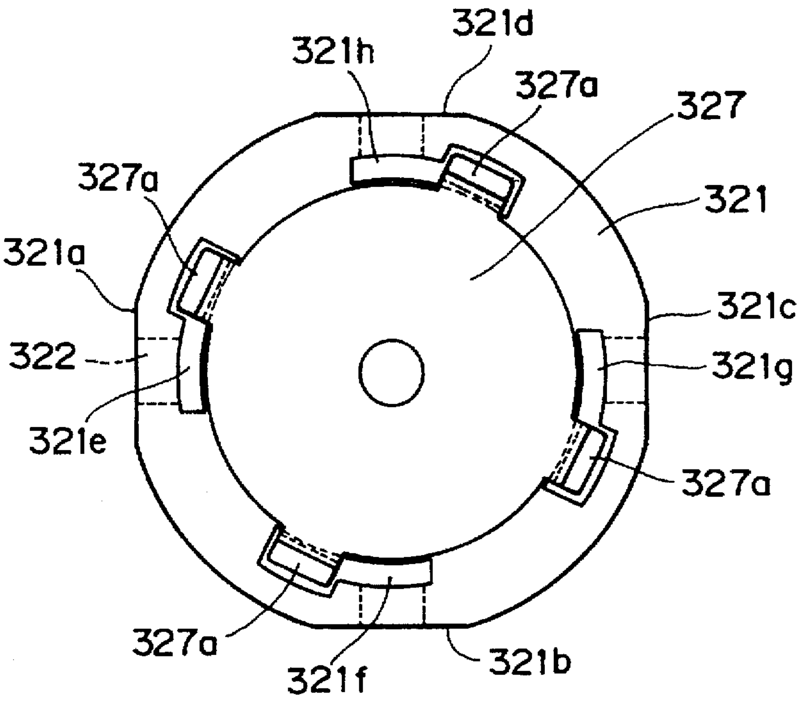
FIG. 23A and FIG. 23B are illustrative views which show a flexible wiring plate fitting portion for an ink jet recording apparatus constructed in accordance with accordance with an eighth embodiment of the present invention, respectively, wherein a plurality of contacts are distributively arranged on a flexible wiring plate as shown in FIG. 2.
Figure 23B:
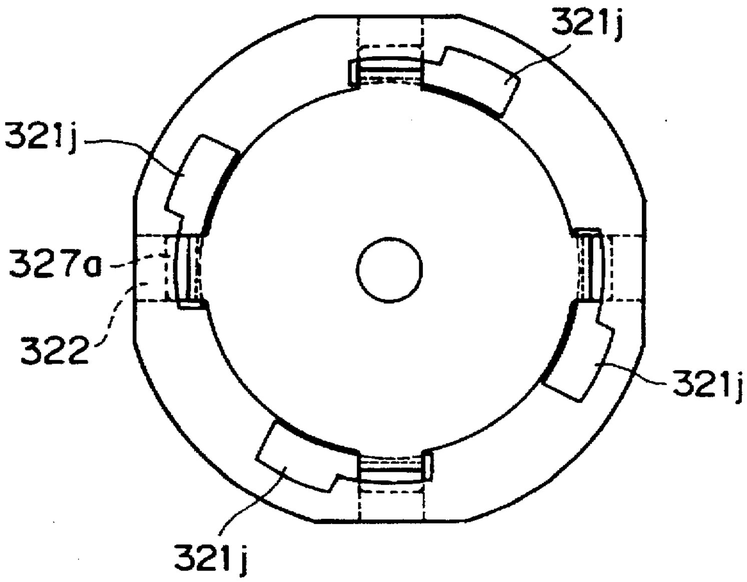

FIG. 23A and FIG. 238 show by way of illustrative views a flexible wiring plate fitting portion for an ink jet recording apparatus constructed in accordance with another embodiment of the present invention, respectively. In this embodiment, four opening portions 321*e* to 321*h* are formed on a base plate 321, and the right-hand side of each of the opening portions 321*e* to 321*h* is enlarged to exhibit a large arched opening portion 321*j*. When a flexible wiring plate 327 is assembled with the base plate 321, each connecting portion 327*a* is first received in the corresponding large arched opening portion 321*j* as shown in FIG. 23A. Thereafter, as shown in FIG. 23B, the flexible wiring plate 327 is turned in the anticlockwise direction so that each connecting portion 327*a* faces to a connecting pattern portion 322*b* of a head tip 322. While the foregoing state is maintained, the connecting portions 327*a* and the connecting pattern portions 322*b* are brought in contact with each other and then soldered to each other. In this embodiment, since the connecting portions 327*a* are preliminarily bent so as to face to the connecting pattern portions 322*b* of the head tip 322, the recording head unit for the ink jet recording apparatus can be assembled at improved efficiency.

Figure 24:
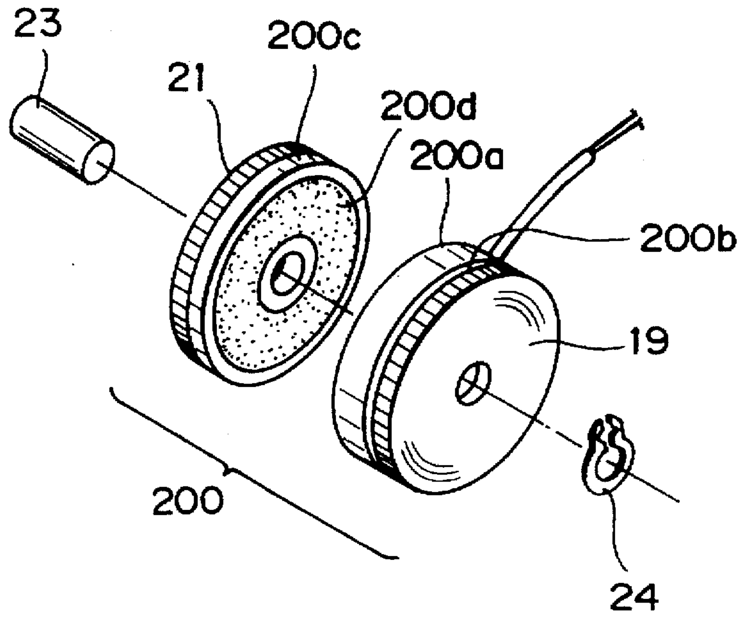
FIG. 24 is a perspective view of a clutch portion for an ink jet recording apparatus constructed in accordance with a tenth embodiment of the present invention, showing essential components constituting the clutch portion in the disassembled state.

FIG. 24 is a perspective view of a clutch portion for an ink jet recording apparatus constructed in accordance with another embodiment of the present invention. In this embodiment, a clutch gear 19 is involved in an electromagnetic clutch 200 of which main body 200*a* has a rotation transmitting portion 200*b* attached thereto. Similarly, a changing gear 21 is involved in the electromagnetic clutch 200 of which magnetic attractive plate 200*c* is attached to the changing gear 21. In addition, an attractive surface of the magnetic attractive plate 200*c* is coated with a lining layer 200*d* made of a material having a high frictional coefficient such cork or a similar material.

A mode of color changing operation will be described below with reference to FIG. 24 and FIG. 2.

When the recording head unit 32 is to be rotated, first, the changing solenoid 27 is activated to turn the changing lever 25 in the arrow A direction as seen in FIG. 2 so as to release the locking portion 25*b* from the engaged state, and subsequently, the electromagnetic clutch 200 is turned on, causing the magnetic attractive plate 200*c* to be rotated by a predetermined angular quantity. Thereafter, when the locking portion 25*b* of the changing lever 25 is engaged with the next positioning hole 324*i* on the recording head unit 32, the electromagnetic clutch 200 is turned off to stop transmitting the rotational power. In this embodiment, since no load is applied to the drive motor 15 at any time with the exception of the time when the present color employed for a color recording operation is changed to another one, the ink jet recording apparatus has an advantage that the motor 15 can be designed with smaller dimensions.

Figure 25:
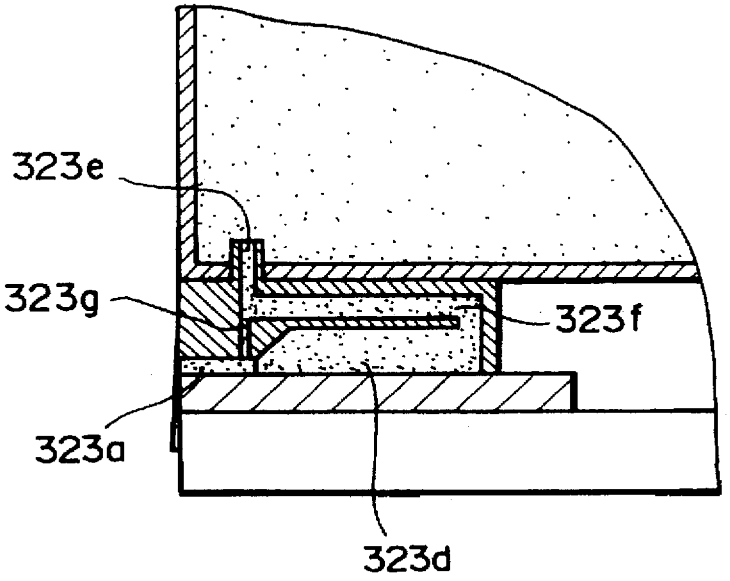
FIG. 25 is a fragmentary enlarged sectional view of a recording head for an ink jet recording apparatus constructed in accordance with a tenth embodiment of the present invention, showing the structure of a section for detecting a quantity of ink remaining in the recording head.

FIG. 25 shows by way of fragmentary enlarged sectional view the structure of a recording head for an ink jet recording apparatus constructed in accordance with a further embodiment of the present invention. In this embodiment, a flow path 323*f* is bent at a right angle relative to an ink introduction path 323*e* to reserve a large space for enlarging a volumetric capacity of holding a large quantity of ink fed from the branching portion. With this construction, since the number of lines capable of being recorded after a quantity of remaining ink is detected can be increased, there does not arise a necessity for detecting a quantity of remaining ink every time one line is recorded. Consequently, the throughput of the ink recording apparatus can be improved.

Figure 26:
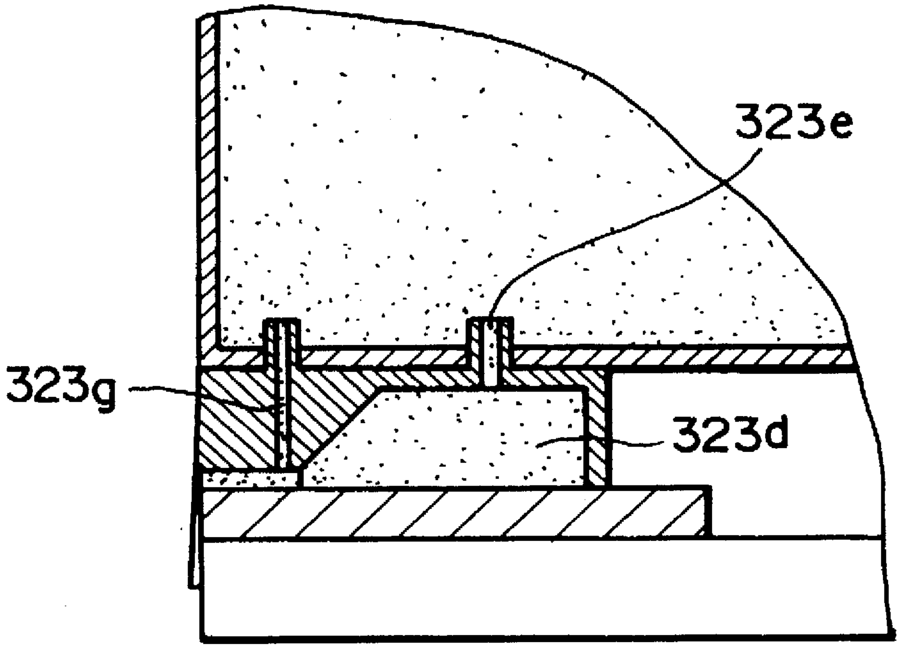
FIG. 26 is a fragmentary enlarged sectional view of a recording head for an ink jet recording apparatus constructed in accordance with an eleventh embodiment of the present invention, showing the structure of a section for detecting a quantity of ink remaining in the recording head.

FIG. 26 shows by way of fragmentary enlarged sectional view the structure of a recording head for an ink jet recording apparatus constructed in accordance with another embodiment of the present invention. In this embodiment, a bypass flow path 323_g_ is caused to extend directly from the interior of an ink tank. In the case that bypass flow path 323_g_ is located upstream an ink introduction path 323_e_ in consideration of an attitude to be assumed by the ink tank, the volumetric capacity of a common chamber 323_d_ inclusive of other ink flow paths is not restrictively limited. Thus, it is possible to reduce the number of times of operations each achieved for detecting a quantity of remaining ink.

Figure 27:
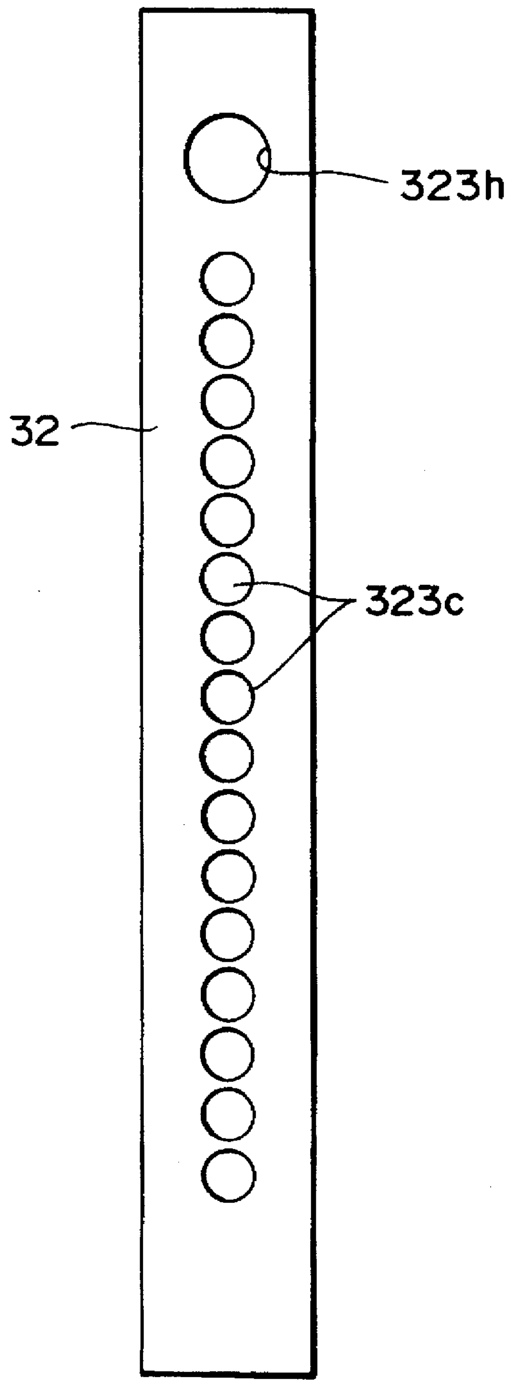
FIG. 27 is a front view of a recording head for an ink jet recording apparatus constructed in accordance with a twelfth embodiment of the present invention.

FIG. 27 shows by way of front view the structure of a recording head for an ink jet recording apparatus constructed in accordance with another embodiment of the present invention. As is apparent from the figure, in this embodiment, a remaining ink quantity detecting nozzle 327_h_ is dimensioned to have a diameter larger than that of each of a plurality of recording nozzles 323_c_. With this construction, the number of ejection drivings to be executed at the time of detection of a quantity of remaining ink can be reduced. Consequently, the ink jet recording apparatus has an advantage that a period of time required for achieving each recording operation can be shortened.

Figure 28:
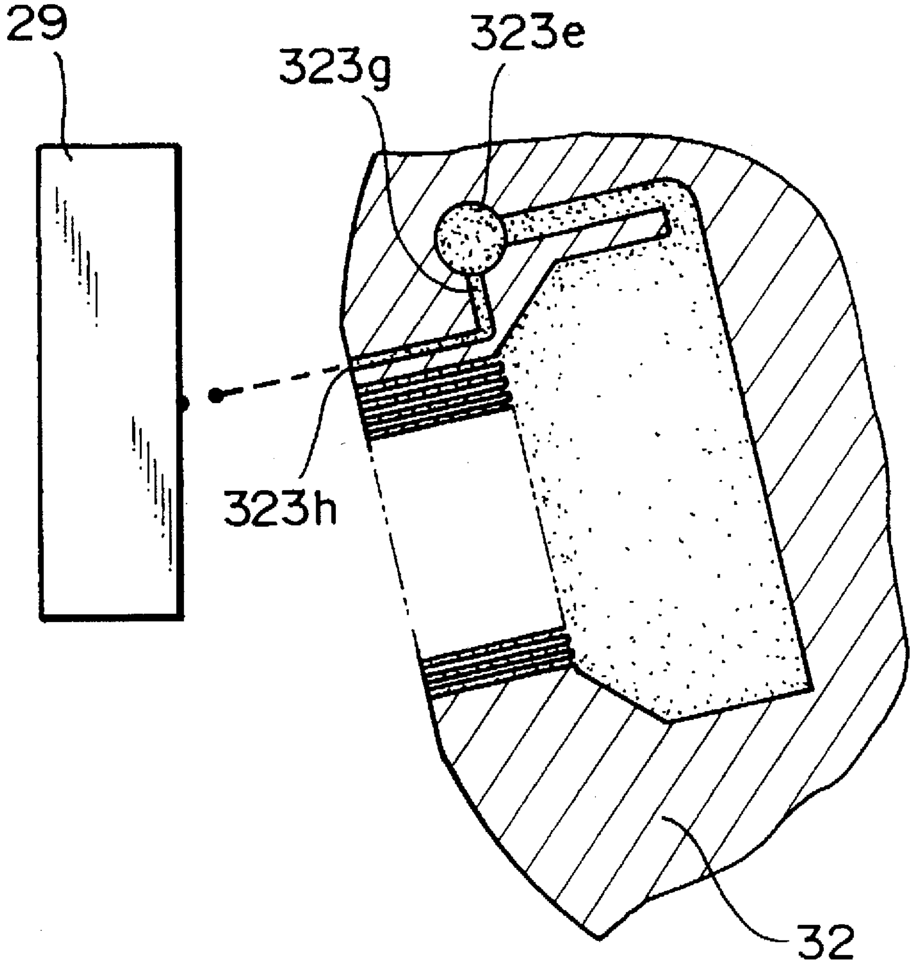
FIG. 28 is a fragmentary enlarged sectional view of a recording head for an ink jet recording apparatus constructed in accordance with a thirteenth embodiment of the present invention.

FIG. 28 shows by way of fragmentary enlarged sectional view the structure of a recording head for an ink jet recording apparatus constructed in accordance with another embodiment of the present invention. In this embodiment, an ink droplet is shot onto a preliminary ejection sensor 29 at the central part of the latter. This type of ink shooting can be realized merely by changing the position where rotation of the recording head unit 32 is stopped. With this construction, each sensing operation can be achieved at a high accuracy by selectively utilizing a good position which assures that the preliminary ejection sensor 29 exhibits excellent responsiveness.

The present invention achieves distinct effect when applied to a recording head or a recording apparatus which has means for generating thermal energy such as electrothermal transducers or laser light, and which causes changes in ink by the thermal energy so as to eject ink. This is because such a system can achieve a high density and high resolution recording.

A typical structure and operational principle thereof is disclosed in U.S. Pat. Nos. 4,723,129 and 4,740,796, and it is preferable to use this basic principle to implement such a system. Although this system can be applied either to on-demand type or continuous type ink jet recording systems, it is particularly suitable for the on-demand type apparatus. This is because the on-demand type apparatus has electrothermal transducers, each disposed on a sheet or liquid passage that retains liquid (ink), and operates as follows: first, one or more drive signals are applied to the electrothermal transducers to cause thermal energy corresponding to recording information; second, the thermal energy induces sudden temperature rise that exceeds the nucleate boiling so as to cause the film boiling on heating portions of the recording head; and third, bubbles are grown in the liquid (ink) corresponding to the drive signals. By using the growth and collapse of the bubbles, the ink is expelled from at least one of the ink ejection orifices of the head to form one or more ink drops. The drive signal in the form of a pulse is preferable because the growth and collapse of the bubbles can be achieved instantaneously and suitably by this form of drive signal. As a drive signal in the form of a pulse, those described in U.S. Pat. Nos. 4,463,359 and 4,345,262 are preferable. In addition, it is preferable that the rate of temperature rise of the heating portions described in U.S. Pat. No. 4,313,124 be adopted to achieve better recording.

U.S. Pat. Nos. 4,558,333 and 4,459,600 disclose the following structure of a recording head, which is incorporated to the present invention: this structure includes heating portions disposed on bent portions in addition to a combination of the ejection orifices, liquid passages and the electrothermal transducers disclosed in the above patents. Moreover, the present invention can be applied to structures disclosed in Japanese Patent Application Laying-open Nos. 123670/1984 and 138461/1984 in order to achieve similar effects. The former discloses a structure in which a slit common to all the electrothermal transducers is used as ejection orifices of the electrothermal transducers, and the latter discloses a structure in which openings for absorbing pressure waves caused by thermal energy are formed corresponding to the ejection orifices. Thus, irrespective of the type of the recording head, the present invention can achieve recording positively and effectively.

The present invention can be also applied to a so-called full-line type recording head whose length equals the maximum length across a recording medium. Such a recording head may consists of a plurality of recording heads combined together, or one integrally arranged recording head.

In addition, the present invention can be applied to various serial type recording heads: a recording head fixed to the main assembly of a recording apparatus; a conveniently replaceable chip type recording head which, when loaded on the main assembly of a recording apparatus, is electrically connected to the main assembly, and is supplied with ink therefrom; and a cartridge type recording head integrally including an ink reservoir.

It is further preferable to add a recovery system, or a preliminary auxiliary system for a recording head as a constituent of the recording apparatus because they serve to make the effect of the present invention more reliable. As examples of the recovery system, are a capping means and a cleaning means for the recording head, and a pressure or suction means for the recording head. As examples of the preliminary auxiliary system, are a preliminary heating means utilizing electrothermal transducers or a combination of other heater elements and the electrothermal transducers, and a means for carrying out preliminary ejection of ink independently of the ejection for recording. These systems are effective for reliable recording.

The number and type of recording heads to be mounted on a recording apparatus can be also changed. For example, only one recording head corresponding to a single color ink, or a plurality of recording heads corresponding to a plurality of inks different in color or concentration can be used. In other words, the present invention can be effectively applied to an apparatus having at least one of the monochromatic, multi-color and full-color modes. Here, the monochromatic mode performs recording by using only one major color such as black. The multi-color mode carries out recording by using different color inks, and the full-color mode performs recording by color mixing.

Furthermore, although the above-described embodiments use liquid ink, inks that are liquid when the recording signal is applied can be used: for example, inks can be employed that solidify at a temperature lower than the room temperature and are softened or liquefied in the room temperature. This is because in the ink jet system, the ink is generally temperature adjusted in a range of 30° C.–70° C. so that the viscosity of the ink is maintained at such a value that the ink can be ejected reliably.

In addition, the present invention can be applied to such apparatus where the ink is liquefied just before the ejection by the thermal energy as follows so that the ink is expelled from the orifices in the liquid state, and then begins to solidify on hitting the recording medium, thereby preventing the ink evaporation: the ink is transformed from solid to liquid state by positively utilizing the thermal energy which would otherwise cause the temperature rise; or the ink, which is dry when left in air, is liquefied in response to the thermal energy of the recording signal. In such cases, the ink may be retained in recesses or through holes formed in a porous sheet as liquid or solid substances so that the ink faces the electrothermal transducers as described in Japanese Patent Application Laying-open Nos. 56847/1979 or 71260/1985. The present invention is most effective when it uses the film boiling phenomenon to expel the ink.

Furthermore, the ink jet recording apparatus of the present invention can be employed not only as an image output terminal of an information processing device such as a computer, but also as an output device of a copying machine including a reader, and as an output device of a facsimile apparatus having a transmission and receiving function.

The present invention has been described in detail with respect to various embodiments, and it will now be apparent from the foregoing to those skilled in the art that changes and modifications may be made without departing from the invention in its broader aspects, and it is the intention, therefore, in the appended claims to cover all such changes and modifications as fall within the true spirit of the invention.

What is claimed is:

1. An ink jet recording apparatus having a recording head for performing a recording operation by ejecting ink from said recording head to a recording medium and means for executing ink ejection by activating said recording head when no recording operation is performed, the apparatus comprising;

a vibration plate disposed opposite the recording head when no recording operation is performed so as to receive ink ejected from the recording head and vibrating upon receipt on said vibration plate of the ink ejected from said recording head when no recording operation is performed;

an electrically conductive plate disposed opposite to said vibration plate, wherein said electrically conductive plate and said vibration plate are disposed relative to each other to provide an electrostatic capacity therebetween, and the electrostatic capacity varies due to an impact of an ejected ink droplet on said vibration plate; and checking means for checking an ink ejecting state of said recording head in accordance with a variation in the electrostatic capacity between said vibration plate and said electrically conductive plate.

2. An ink jet recording apparatus as claimed in claim 1, wherein said vibration plate is produced by vapor depositing aluminum on a substrate of elastic synthetic resin having a very small thickness.

3. An ink jet recording apparatus as claimed in claim 1, further comprising means for removing from said vibration plate the ink ejected upon said vibration plate from said recording head.

4. An ink jet recording apparatus as claimed in claim 3, wherein said removing means comprises an ink absorbing member disposed with a small gap kept between said vibration plate and said ink absorbing member, said ink absorbing member having an opening portion formed therethrough for allowing the ejected ink to pass through said opening portion.

5. An ink jet recording apparatus as claimed in claim 3, wherein said removing means comprises an ink removing plate having an opening portion formed therethrough for allowing the ejected ink to pass through said opening portion, said ink removing plate having an ink conducting groove having a small width additionally formed thereon in continuation from said opening portion.

6. An ink jet recording apparatus as claimed in claim 5, wherein said removing plate is designed as a circular plate, said opening portion is formed at a central part of said ink removing plate, and an outermost end of said ink conducting groove is kept opened on the outer peripheral surface of said circular plate and comes in contact with an ink absorbing member.

7. An ink jet recording apparatus as claimed in claim 3, wherein said removing means includes a layer of water repelling agent coated on said vibration plate or a vibration plate formed with a water repelling material.

8. An ink jet recording apparatus as claimed in claim 7, wherein said vibration plate is inclined at a predetermined angle, and an ink absorbing member is disposed below said vibrating plate.

9. An ink jet recording apparatus as claimed in claim 1, wherein said ink jet recording apparatus includes a plurality of recording heads corresponding to plural kinds of inks of which color tones are different from each other, a present recording head is changed to an other recording head every time a single unit of recording operation is achieved with the present recording head, and activation of the other recording head to be executed when no recording operation is performed is executed in a course of changing of the present recording head to the other recording head.

10. An ink jet recording apparatus as claimed in claim 9, wherein each of said recording heads is scanned in a predetermined direction relative to said recording medium, and said changing of the present recording head to the other recording head is executed every time single scanning is completed.

11. An ink jet recording apparatus as claimed in claim 1, wherein said recording head includes an element for generating thermal energy required for inducing a phenomenon of film boiling in ink as energy to be utilized for ejecting ink therefrom.

12. An ink jet recording apparatus as claimed in claim 11, wherein the ink ejected from said opening portion is received on said vibration plate so as to determine whether or not a certain quantity of ink remains in an ink supply source.

13. An ink jet recording apparatus having a recording head for performing a recording operation by ejecting ink from said recording head to a recording medium and means for executing ink ejection by activating said recording head when no recording operation is performed, the apparatus comprising:

checking means for checking an ink ejecting state of said recording head on receipt of the ink ejected from said recording head when no recording operation is performed, said checking means comprising a first sensor having a vibration plate disposed opposite the recording head when no recording operation is performed so as to receive the ink ejected from the recording head and vibrating upon receipt on said vibrating plate of the ink ejected from said recording head when no recording operation is performed, so that said checking means checks the ink ejecting state of the recording head in response to an output from said first sensor;

an electrically conductive plate disposed opposite to said vibration plate, wherein said electrically conductive plate and said vibration plate are disposed relative to each other to provide an electrostatic capacity therebetween and the electrostatic capacity varies due to an impact of an ejected ink droplet on said vibration plate, said first sensor providing an indication of the ink ejection state of said recording head in accordance with a variation in the electrostatic capacity between said vibration plate and said electrically conductive plate; and noise sensing means for sensing an exterior noise associated with said checking means.

14. An ink jet recording apparatus as claimed in claim 13, wherein said noise sensing means comprises a second sensor having a vibration plate adapted to vibrate on receipt of a sound wave, and noise is sensed in response to an output from said second sensor.

15. An ink jet recording apparatus as claimed in claim 14, further comprising a magnetic circuit including said vibration plate, and wherein a certain intensity of induced electromotive force generated in the magnetic circuit including said vibration plate is used for said second sensor.

16. An ink jet recording apparatus as claimed in claim 14, wherein the variation of an electrostatic capacity arising between said vibration plate and a electrical conductive plate disposed opposite to said vibration plate is used for said second sensor.

17. An ink jet recording apparatus as claimed in claim 14, further comprising means for reversing the output from said second sensor and the reversed output is synthesized with the output from said first sensor so that a checking operation is performed in response to the resultant synthesized output.

18. An ink jet recording apparatus as claimed in claim 13, further comprising means for reversing an output from said noise sensing means, wherein the reversed output is synthesized with an output generated on receipt of the ejected ink so that a checking operation is performed in response to the resultant synthesized output.

19. An ink jet recording apparatus as claimed in claim 13, wherein said noise sensing means is mounted on a controlling circuit board of said ink jet recording apparatus.

20. An ink jet recording apparatus as claimed in claim 13, further comprising changing means for changing a frequency of activating said recording head for executing said checking when no recording operation is performed.

21. An ink jet recording apparatus as claimed in claim 13, wherein said checking means serves to check that no ink is ejected from said recording head, and to determine an ejected ink speed from said recording head by measuring a time which elapses from ink ejection till receipt of the ejected ink.

22. An ink jet recording apparatus as claimed in claim 13, wherein said ink jet recording apparatus includes a plurality of recording heads corresponding to plural kinds of inks of which color tones are different from each other, a present recording head is changed to an other recording head every time a single unit of recording operation is achieved with the present recording head, and activation of the other recording head to be executed while no recording operation is performed is executed in a course of changing of the present recording head to the other recording head.

23. An ink jet recording apparatus as claimed in claim 22, wherein each of said recording heads is scanned in a predetermined direction relative to said recording medium, and said changing of the present recording head to the other recording head is executed every time single scanning is completed.

24. An ink jet recording apparatus as claimed in claim 23, wherein each of said recording heads includes an element for generating thermal energy required for inducing a phenomenon of film boiling in ink as energy to be utilized for ejecting ink therefrom.

* * * * *

UNITED STATES PATENT AND TRADEMARK OFFICE
CERTIFICATE OF CORRECTION

PATENT NO. : 5,731,826

DATED : March 24, 1998

INVENTOR(S) : HIROFUMI HIRANO

It is certified that error appears in the above-identified patent and that said Letters Patent is hereby corrected as shown below:

COLUMN 1

Line 21, "a various kind" should read --various kinds--.
Line 22, "system" should read --systems--; and
Line 31, "noisy sound" should read --noise--.

COLUMN 2

Line 5, "can not" should read --cannot--.

COLUMN 3

Line 19, "comprising;" should read --comprising:--; and
Line 38, "comprise;" should read --comprise:--.

COLUMN 4

Line 5, "comprising;" should read --comprising:--;
Line 33, "a" should read --an--; and
Line 52, "comprising;" should read --comprising:--.

COLUMN 5

Line 36, "comprising;" should read --comprising:--;
Line 62, "be" should be deleted; and
Line 67, "as defined in" should be deleted.

UNITED STATES PATENT AND TRADEMARK OFFICE
CERTIFICATE OF CORRECTION

PATENT NO. : 5,731,826

DATED : March 24, 1998

INVENTOR(S) : HIROFUMI HIRANO

It is certified that error appears in the above-identified patent and that said Letters Patent is hereby corrected as shown below:

COLUMN 6

Line 1, "claim 33 or 34" should be deleted;
Line 5, "comprising;" should read --comprising:--;
Line 28, "comprise;" should read --comprise:--;
Line 45, "comprising;" should read --comprising:--;
Line 57, "comprising;" should read --comprising:--; and
Line 67, "n" should read --an-- and
"comprising;" should read --comprising:--.

COLUMN 7

Line 1, "as" should be deleted;
Line 2, "defined in claim 36" should be deleted;
Line 6, "n" should read --an-- and
"comprising;" should read --comprising:--;
Line 7, "as" should be deleted;
Line 8, "defined in claim 37" should be deleted;
Line 13, "losing" should read --closing--;
Line 14, "comprise;" should read --comprise:--;
Line 26, "of;" should read --of:--; and
Line 37, "e.g.," should read --(e.g.,--.

COLUMN 8

Line 36, "apparatus" should read --apparent--;
Line 67, "pulses" should read
--pulses (shown in Fig. 8B)--.

CERTIFICATE OF CORRECTION

PATENT NO. : 5,731,826

DATED : March 24, 1998

INVENTOR(S) : HIROFUMI HIRANO

It is certified that error appears in the above-identified patent and that said Letters Patent is hereby corrected as shown below:

COLUMN 9

Line 3, "shown" should read --(shown--.

COLUMN 10

Line 55, "to" should be deleted.

COLUMN 11

Line 10, "liquidtightly" should read --liquid-tightly--; and
Line 62, "supporter" should read --supporters--.

COLUMN 14

Line 36, "latter. An outer" should read --latter. ¶ An outer--.

COLUMN 15

Line 5, "to" (first occurrence) should be deleted.

COLUMN 17

Line 12, "usable" should read --usable for--.

COLUMN 20

Line 25, "H-P" should read --H·P--; and
Line 45, "used). In this" should read --used). ¶ In this--.

UNITED STATES PATENT AND TRADEMARK OFFICE
CERTIFICATE OF CORRECTION

PATENT NO. : 5,731,826

DATED : March 24, 1998

INVENTOR(S) : HIROFUMI HIRANO

It is certified that error appears in the above-identified patent and that said Letters Patent is hereby corrected as shown below:

COLUMN 21

Line 37, "on-the" should read --on the--; and
Line 47, "can not" should read --cannot--.

COLUMN 22

Line 12, "to" should be deleted;
Line 17, "Next" should read --Next,--;
Line 26, "he" should read --the--; and
Line 62, "0n" should read --On--.

COLUMN 23

Line 19, "can not" should read --cannot--.

COLUMN 24

Line 24, "bee" should read --be--; and
Line 47, "a-preceding" should read --a preceding--.

COLUMN 25

Line 19, "to" should be deleted;

COLUMN 26

Line 8, "Also" should read --Also,--; and
Line 20, "Other embodiments)" should read --Other Embodiments--.

UNITED STATES PATENT AND TRADEMARK OFFICE
CERTIFICATE OF CORRECTION

PATENT NO. : 5,731,826

DATED : March 24, 1998

INVENTOR(S) : HIROFUMI HIRANO

It is certified that error appears in the above-identified patent and that said Letters Patent is hereby corrected as shown below:

COLUMN 27

Line 41, "0n" should read --On--.

COLUMN 28

Line 1, "FIG. 238" should read --FIG 23B--;
Line 14, "to" should be deleted;
Line 20, "to" (second occurrence) should be deleted; and
Line 34, "such" should read --such as--.

COLUMN 30

Line 21, "consists" should read --consist--; and
Line 67, "follows" should read --follows,--.

COLUMN 31

Line 6, "in air," should read --in the air,--; and
Line 32, "comprising;" should read --comprising:--.

COLUMN 33

Line 24, "a" should read --an--.

UNITED STATES PATENT AND TRADEMARK OFFICE
CERTIFICATE OF CORRECTION

PATENT NO. : 5,731,826

DATED : March 24, 1998

INVENTOR(S) : HIROFUMI HIRANO

It is certified that error appears in the above-identified patent and that said Letters Patent is hereby corrected as shown below:

COLUMN 34

Line 5, "comprising" should read --comprising:--.

Signed and Sealed this

Seventh Day of September, 1999

Attest:

Q. TODD DICKINSON

*Attesting Officer*

*Acting Commissioner of Patents and Trademarks*